United States Patent
Song

(10) Patent No.: US 8,437,209 B2
(45) Date of Patent: May 7, 2013

(54) INTEGRATED CIRCUIT

(75) Inventor: Choung-Ki Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 148 days.

(21) Appl. No.: 12/980,482

(22) Filed: Dec. 29, 2010

(65) Prior Publication Data

US 2012/0106227 A1    May 3, 2012

(30) Foreign Application Priority Data

Oct. 29, 2010 (KR) .................... 10-2010-0106778

(51) Int. Cl.
*G11C 29/00* (2006.01)
(52) U.S. Cl.
USPC ............ 365/201; 365/189.04; 365/230.01; 365/189.011; 365/191; 365/63
(58) Field of Classification Search ......... 365/201, 365/189.04, 230.01, 189.011, 63, 191
See application file for complete search history.

(56) References Cited

U.S. PATENT DOCUMENTS

2008/0244157 A1 * 10/2008 Kim ........................ 711/100

FOREIGN PATENT DOCUMENTS

| KR | 100719377 | 5/2007 |
| KR | 1020090004494 | 1/2009 |

OTHER PUBLICATIONS

Notice of Allowance issued by the Korean Intellectual Property Office on Feb. 28, 2012.

* cited by examiner

*Primary Examiner* — Thong Q Le
(74) *Attorney, Agent, or Firm* — IP & T Group LLP

(57) ABSTRACT

An integrated circuit includes a normal data storage unit configured to store normal data and output the stored normal data in response to a write command, a read command, and an address signal in a normal operation mode, a test data storage unit configured to store the address signal as test data in response to the write command in a test operation mode, and output the stored test data in response to the read command, and a connection selection unit configured to selectively connect a data input/output terminal of the normal data storage unit or a data output terminal of the test data storage unit to a global line based on whether the integrated circuit is in a first or second one of the normal operation mode and the test operation mode, respectively.

31 Claims, 8 Drawing Sheets

INTEGRATED CIRCUIT

CROSS-REFERENCE TO RELATED APPLICATIONS

The present application claims priority of Korean Patent Application No. 10-2010-0106778, filed on Oct. 29, 2010, which is incorporated herein by reference in its entirety.

BACKGROUND OF THE INVENTION

Exemplary embodiments of the present invention relate to an integrated circuit design technology, and more particularly, to a multi purpose register (MPR) of an integrated circuit.

In a system implemented with a plurality of semiconductor devices, an integrated circuit serves to store data. When a data processing device or the like (for example, a central processing unit (CPU)) requires a data input/output operation, an integrated circuit reads data from a core region that corresponds to an address inputted from the data requesting device or stores data provided from the data requesting device in, for example, a random space of a core region corresponding to the address.

Meanwhile, as the operating speed of the system implemented with semiconductor devices is becoming faster and the manufacturing technology for semiconductor integrated circuits has rapidly advanced, integrated circuits are desired to output or store data at a faster speed. Here, in order for integrated circuits to stably operate at a faster speed, circuits for providing data input/output accuracy is further provided in addition to a core region and a peripheral region for data input/output operations which are provided within integrated circuits.

Therefore, integrated circuits are to have a storage space for storing information generated by operations for obtaining the data input/output accuracy. For such storage purpose, an MPR may be used.

For example, an MPR has been used in a double data rate 3 (DDR3) synchronous dynamic random access memory (SDRAM) in order to support a read leveling operation.

The read leveling operation refers to an operation which transfers a data pattern, which is previously defined in a register within a memory chip, to a chip set and adjusts a DQS skew between the chip set and the memory chip. At this time, the operation of reading the data pattern stored in the register is performed without regard to normal data stored in a memory cell. Therefore, it is unnecessary to perform a type of a memory access operation which enables word lines or precharges bit lines in order to read data patterns.

A conventional MPR is used to store a data pattern which is not stored in a memory cell but a value of which is previously defined. Since the conventional MPR operates in such a state where it has a 'fixed value read-out' characteristic, an MPR rewrite operation which separately writes data is not needed. That is, if the memory chip of the semiconductor system is set to a read leveling operation mode (MPR mode), a predefined data pattern such as '10101010' is outputted when a read command is inputted, without inputting an active command to the memory chip. Thus, a tuning operation (tDS/tDH) for a high speed operation between the semiconductor system and the memory chip can be performed.

However, in a memory product such as DDR4 SDRAM, a method in which a semiconductor system writes pattern data is being considered, instead of a method in which a value of pattern data is stored in and outputted from an MPR. That is, the MPR has not a 'fixed value read-out' characteristic but a 'non-fixed value read-out' characteristic.

As the characteristic of the MPR is changed, more interconnections are required in order for normal data input/output. In addition, the storage space of the MPR may increase.

SUMMARY OF THE INVENTION

An embodiment of the present invention is directed to a circuit which can obtain adequate input/output characteristics of an MPR.

Another embodiment of the present invention is directed to a circuit which can maximally reduce the increase of a space occupied by an MPR in an integrated circuit while meeting adequate input/output characteristics of an MPR.

In accordance with an embodiment of the present invention, an integrated circuit includes: a normal data storage unit, configured to store normal data and output the stored normal data in response to a write command, a read command, and an address signal in a normal operation mode; a test data storage unit configured to store the address signal as test data in response to the write command in a test operation mode, and output the stored test data in response to the read command; and a connection selection unit configured to selectively connect a data input/output terminal of the normal data storage unit or a data output terminal of the test data storage unit to a global line based on whether the integrated circuit is in a first or second one of the normal operation mode and the test operation mode, respectively.

In accordance with another embodiment of the present invention, an integrated circuit includes: an address input line configured to receive an address signal; a mode configuration control unit configured to output the address signal, which is received through the address input line, as test data or mode configuration code to a mode configuration line in response to a test entry control signal; a test data storage unit configured to store the test data received through the mode configuration line in response to a test write command and output the stored test data to a global line in response to a test read command; and an internal circuit configured to be set to a preset internal operation mode in response to the test entry control signal and the mode configuration code received through the mode configuration line.

In accordance with yet another embodiment of the present invention, an integrated circuit includes: an address input line configured to receive an address signal; a mode configuration control unit configured to output the address signal, which is received through the address input line, as test data or mode configuration code to a mode configuration line in response to a test entry control signal; a test data storage unit configured to store the test data received through the mode configuration line in response to a test write command and output the stored test data to a first global line and a second global line in response to a test read command; and an internal circuit configured to be set to a preset internal operation mode in response to the test entry control signal and the mode configuration code received through the mode configuration line.

DESCRIPTION OF SPECIFIC EMBODIMENTS

Figure 1:
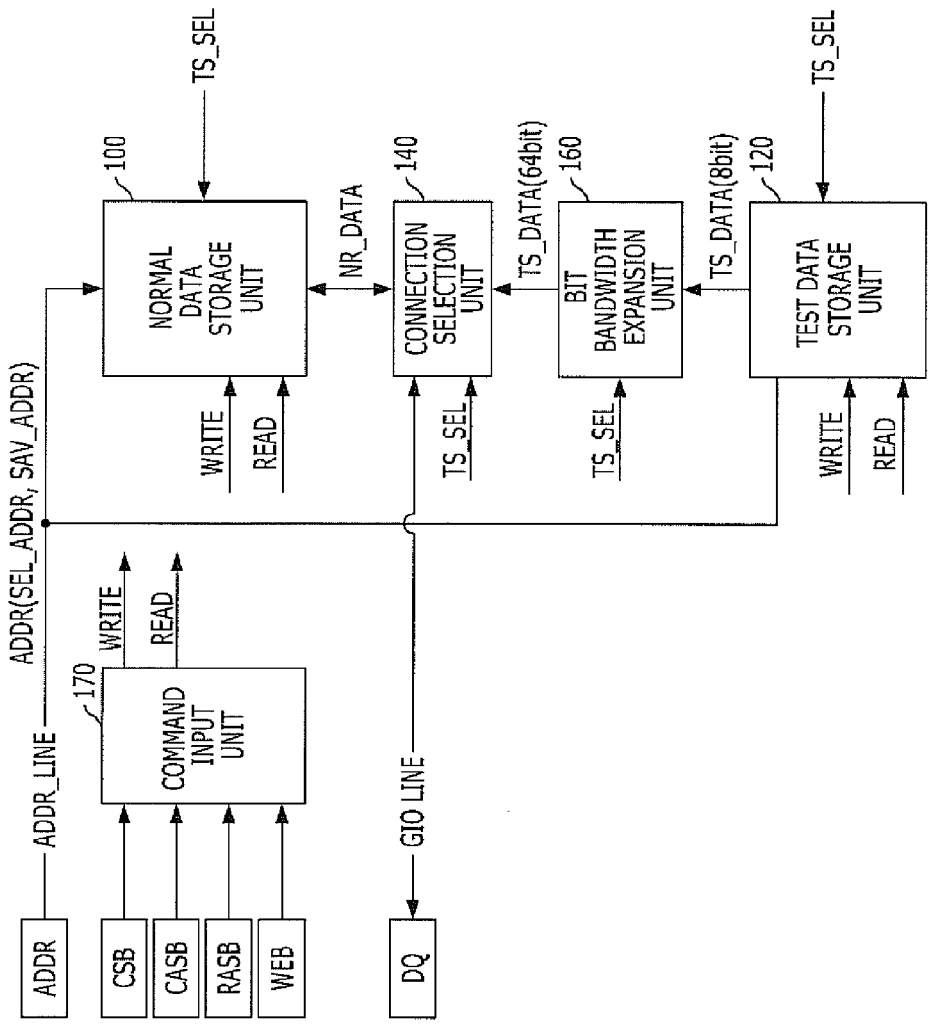
FIG. 1 is a block diagram illustrating the configuration of an MPR operation circuit in an integrated circuit in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

<First Embodiment>

FIG. 1 is a block diagram illustrating the configuration of an MPR operation circuit in an integrated circuit in accordance with a first embodiment of the present invention.

Referring to FIG. 1, the MPR operation circuit in the integrated circuit in accordance with the first embodiment of the present invention includes a normal data storage unit 100, a test data storage unit 120, and a connection selection unit 140. In a normal operation mode in which a signal TS_SEL is at a logic low level, the normal data storage unit 100 stores normal data NR_DATA in response to a write command WRITE, a read command READ, and an address signal ADDR, and outputs the stored normal data NR_DATA. In a test operation mode in which the signal TS_SEL is at a logic high level, the test data storage unit 120 stores the address signal ADDR as test data TS_DATA in response to the write command WRITE, and outputs the stored test data TS_DATA in response to the read command READ. The connection selection unit 140 selectively connects a data input/output terminal of the normal data storage unit 100 and a data output terminal of the test data storage unit 120 to a global line GIO_LINE according to the operation mode.

The MPR operation circuit further includes an address input line ADD_LINE through which the address signal ADDR is inputted in the normal operation mode and the test operation mode. In the normal operation mode, the normal data NR_DATA is inputted/outputted through the global line GIO_LINE. In the test operation mode, the test data TS_DATA is outputted through the global line GIO_LINE.

The MPR operation circuit further includes a command input unit 170 which receives a chip select signal CSB, a column strobe signal CASB, a row strobe signal RASB, and a write enable signal WEB, and generates the write command WRITE and the read command READ.

In addition, the MPR operation circuit further includes a bit bandwidth expansion unit 160 which expands a bit bandwidth (8 bits) of the test data TS_DATA, outputted through the data output terminal of the test data storage unit 120 in the test operation mode, to a set value (for example, 64 bits) to thereby make the bit bandwidth (8 bits) equal to a bit bandwidth (64 bits) of the global line GIO_LINE.

The bit bandwidth expansion unit 160 is provided because the data bandwidth of the address input line ADDR_LINE and the data bandwidth of the global line GIO_LINE differ from each other and, according to an example, the data bandwidth of the global line GIO_LINE is greater than the data bandwidth of the address input line ADDR_LINE. That is, the test data TS_DATA is inputted to the test data storage unit 120 through the address input line ADDR_LINE, and the test data TS_DATA stored in the test data storage unit 120 is outputted through the global line GIO_LINE.

Therefore, the bit bandwidth expansion unit 160 performs an operation of converting the test data TS_DATA (8 bits) having a small data bandwidth into the test data TS_DATA (64 bits) having a large data bandwidth. A method of repeatedly copying the same data may be used. For example, the test data TS_DATA (64 bits) having a larger data bandwidth may be generated by copying the test data TS_DATA (8 bits) having a small data bandwidth eight times.

The normal data storage unit 100 includes a plurality of data storage spaces (not shown) which can store normal data NR_DATA. In the normal operation mode, a data storage space corresponding to the address signal ADDR is selected among the plurality of data storage spaces, and the normal data NR_DATA stored in the selected data storage space is outputted through the global line GIO_LINE when the write command is activated. In the test operation mode, the normal data NR_DATA is not to be stored, regardless of whether the write command WRITE is activated or the read command READ is activated.

The normal data storage unit 100 according to an example may be a plurality of banks which store normal data in a semiconductor device. More specifically, the normal data storage unit 100 may be any reasonably suitable group of banks which perform minimum read/write operations in accordance with the first embodiment of the present invention.

In addition, the configuration of the test data storage unit 120 can be divided into two schemes according to the operation thereof.

The first scheme is a scheme for a situation where the test data storage unit 120 has a minimum storage space.

Specifically, a test data storage space (not shown) capable of storing the test data TS_DATA is provided inside the test data storage unit 120, and the address signal ADDR inputted through the address input line ADDR_LINE is stored as the test data TS_DATA when the write command WRITE is activated in the test operation mode. Likewise, the stored test data TS_DATA is outputted through the global line GIO_LINE when the read command READ is activated in the test operation mode. In the normal operation mode, the address signal ADDR inputted through the address input line ADDR_LINE is not stored as the test data TS_DATA, regardless of whether the write command WRITE is activated or the read command READ is activated.

That is, the test data storage unit 120 in accordance with the first scheme operates so that one address signal ADDR is stored as one test data TS_DATA in such a state where the test data storage unit 120 has a minimum storage space.

The second scheme is a scheme for a situation where the test data storage unit 120 has a sufficient storage space.

Specifically, the test data storage unit 120 includes a plurality of test data storage spaces (not shown) which can be selected by a value of predetermined bits SEL_ADDR set in the address signal ADDR inputted through the address input line ADDR_LINE, and can store the remaining bits SAV_ADDR, except for the predetermined bits SEL_ADDR, as the test data TS_DATA. In the test operation mode, the test data storage unit 120 selects one storage space corresponding to the set predetermined bits SEL_ADDR of the address signal ADDR among the plurality of test data storage spaces, and stores the remaining bits TD_SAV of the address signal ADDR as the test data TS_DATA in the selected storage space when the write command WRITE is activated. Likewise, the test data storage unit 120 selects one storage space corresponding to the set predetermined bits SEL_ADDR of the address signal ADDR among the plurality of test data storage spaces, and outputs the test data TS_DATA stored in the selected data storage space through the global line GIO_LINE in the selected data storage space when the read command READ is activated. In the test operation mode, the predetermined bits SEL_ADDR of the address signal ADDR inputted together with the read command READ is used to select the data storage space. However, the remaining bits SAV_ADDR of the address signal ADDR are discarded without being used. On the other hand, in the normal operation mode, the address signal ADDR is not stored as the test data TS_DATA, regardless of whether the write command WRITE is activated or the read command READ is activated.

That is, the test data storage unit 120 in accordance with the second scheme is constructed so that the test data storage unit 120 performs an operation of separately storing several address signals ADDR as several test data TS_DATA in such a state where it has a sufficient storage space.

The test data storage unit 120 may be any reasonable suitable MPR which stores pattern data including an MPR which performs a minimum read/write operation in accordance with the first embodiment of the present invention.

The connection selection unit 140 connects the data input/output terminal of the normal data storage unit 100 to the global line GIO_LINE in the normal operation mode, and connects the data output terminal of the test data storage unit 120 to the global line GIO_LINE in the test operation mode.

Specifically, when the signal TS_SEL used to select the normal operation mode or the test operation mode is deactivated to a logic low level, the integrated circuit enters the normal operation mode and the connection selection unit 140 allows the normal data NR_DATA to be inputted/outputted between the normal data storage unit 100 and the global line GIO_LINE. Likewise, when the signal TS_SEL is activated to a logic high level, the integrated circuit enters the test operation mode and the connection selection unit 140 allows the test data TS_DATA stored in the test data storage unit 120 to be outputted through the global line GIO_LINE.

As described, since the test data TS_DATA stored in the test data storage unit 120 corresponding to the MPR is applied to a semiconductor system through the address input line ADDR_LINE, it can be seen that its value is variable through the semiconductor system. Thus, input/output characteristic of the MPR for a memory product group may be adequately obtained.

<Second Embodiment>

Figure 2:
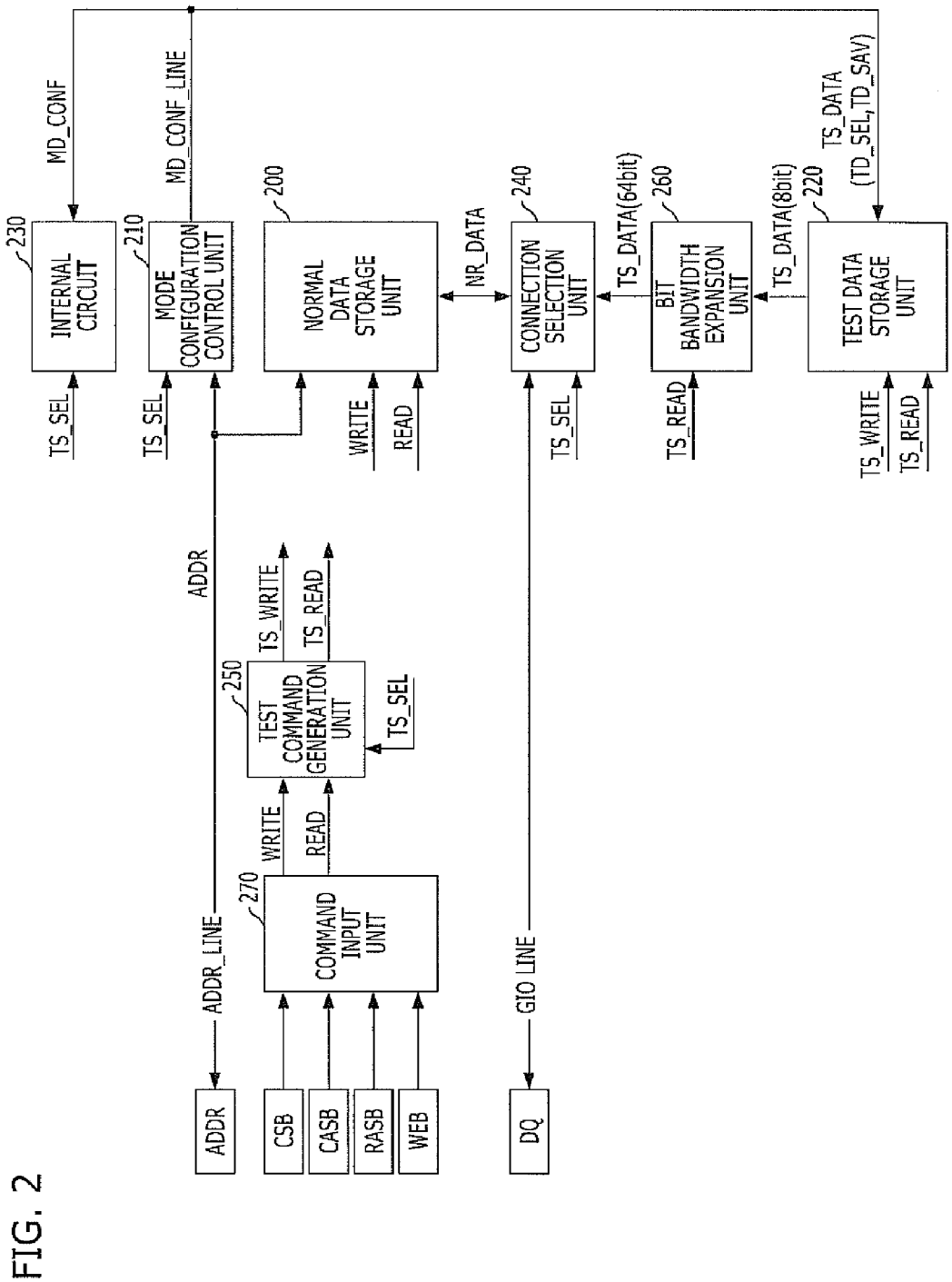
FIG. 2 is a block diagram illustrating the configuration of an MPR operation circuit in an integrated circuit in accordance with a second embodiment of the present invention.

FIG. 2 is a block diagram illustrating the configuration of an MPR operation circuit in an integrated circuit in accordance with a second embodiment of the present invention.

Referring to FIG. 2, the MPR operation circuit in the integrated circuit in accordance with the second embodiment of the present invention includes an address input line ADDR_LINE, a mode configuration control unit 210, a test data storage unit 220, and an internal circuit 230. The address input line ADDR_LINE is configured to receive an address signal. The mode configuration control unit 210 outputs the address signal ADDR, which is inputted through the address input line ADDR_LINE, to a mode configuration line MD_CONF_LINE as test data TS_DATA or a mode configuration code MD_CONF in response to a test entry control signal TS_SEL. The test data storage unit 220 stores the test data TS_DATA inputted through the mode configuration line MD_CONF_LINE in response to a test write command TS_WRITE, and outputs the stored test data TS_DATA through a global line GIO_LINE in response to a test read command TS_READ. The internal circuit 230 is configured to set to a preset internal operation mode in response to the test entry control signal TS_SEL and the mode configuration code MD_CONF inputted through the mode configuration line MD_CONF_LINE.

In addition, the MPR operation circuit further includes a test command generation unit 250 which generates the test write command TS_WRITE in response to the test entry control signal TS_SEL and the write command WRITE, and generates the test read command TS_READ in response to the test entry control signal TS_SEL and the read command READ.

Furthermore, the MPR operation circuit further includes a normal data storage unit 200 and a connection selection unit 240. The normal data storage unit 200 stores normal data NR_DATA inputted through the global line GIO_LINE in response to the write command WRITE and the address signal ADDR inputted through the address input line ADDR_LINE, and outputs the stored normal data NR_DATA through the global line GIO_LINE in response to the read command READ and the address signal ADDR inputted through the address input line ADDR_LINE. The connection selection unit 240 selectively connects the normal data storage unit 200 and the test data storage unit 220 to the global line GIO_LINE in response to the test entry control signal TS_SEL.

In addition, the MPR operation circuit further includes a bit bandwidth expansion unit 260 which expands a bit bandwidth (8 bits) of the test data TS_DATA, outputted through the data output terminal of the test data storage unit 220 when the test read command TS_READ is activated, to a set value to thereby make the bit bandwidth (8 bits) equal to a bit bandwidth (64 bits) of the global line GIO_LINE.

Furthermore, the MPR operation circuit further includes a command input unit 270 which receives a chip select signal CSB, a column strobe signal CASB, a row strobe signal RASB, and a write enable signal WEB, and generates the write command WRITE and the read command READ.

For reference, although it is illustrated in FIG. 2 as if the test command generation unit 250 and the mode configuration control signal 210 are separated from each other and individually perform their operations, such an illustration is for purposes of providing clarity. The elements can also be grouped as a single element that performs the above described functions.

In addition, in implementing integrated circuits, the operations of the test command generation unit 250 and the mode configuration control unit 210 may be defined in a mode register set (MRS). Therefore, a combination of the test command generation unit 250 and the mode configuration control unit 210 is illustrated in FIG. 3B.

The operation of the respective elements of the MPR operation circuit in the integrated circuit in accordance with the second embodiment of the present invention will be described in detail below.

The bit bandwidth expansion unit 260 is provided because the data bandwidth of the address input line ADDR_LINE and the data bandwidth of the global line GIO_LINE differ from each other and, in general, the data bandwidth of the global line GIO_LINE is greater than the data bandwidth of the address input line ADDR_LINE. That is, the test data TS_DATA is inputted to the test data storage unit 220 through the address input line ADDR_LINE, and the test data TS_DATA stored in the test data storage unit 220 is outputted through the global line GIO_LINE.

Therefore, the bit bandwidth expansion unit 260 performs an operation of converting the test data TS_DATA (8 bits) having a small data bandwidth into the test data TS_DATA (64 bits) having a large data bandwidth. A method of repeatedly copying the same data is often used. For example, the test data TS_DATA (64 bits) having a larger data bandwidth is generated by copying the test data TS_DATA (8 bits) having a small data bandwidth eight times.

In an activation period of the test entry control signal TS_SEL, the test command generation unit 250 activates the test write command TS_WRITE when the write command WRITE is activated and deactivates the test write command TS_WRITE when the write command WRITE is deactivated. Likewise, in the activation period of the test entry control signal TS_SEL, the test command generation unit 250 activates the test read command TS_READ when the read command READ is activated and deactivates the test read command TS_READ when the read command READ is deactivated. In addition, in a deactivation period of the test entry control signal TS_SEL, the test command generation unit 250 deactivates the test write command TS_WRITE, regardless of whether or not the write command WRITE is activated. Likewise, in the deactivation period of the test entry control signal TS_SEL, the test command generation unit 250 deactivates the test read command TS_READ, regardless of whether or not the read command READ is activated.

The normal data storage unit 200 includes a plurality of normal data storage spaces (not shown) which can store the normal data NR_DATA. The normal data storage unit 200 stores the normal data NR_DATA inputted through the global line GIO_LINE in the data storage space corresponding to the address signal ADDR among the plurality of normal data storage spaces in response to the activation of the write command WRITE in the deactivation period of the test entry control signal TS_SEL. In addition, the normal data storage unit 200 outputs the normal data NR_DATA stored in the data storage space corresponding to the address signal ADDR among the plurality of normal data storage spaces in response to the activation of the read command READ in the deactivation period of the test entry control signal TS_SEL. Furthermore, in the activation period of the test entry control signal TS_SEL, the normal data storage unit 200 performs no reading or storage operation, regardless of whether or not the write command WRITE and the read command READ are activated.

The normal data storage unit 200 can be any reasonable suitable element corresponding to a plurality of banks which store the normal data including banks which perform minimum read/write operations in accordance with the second embodiment of the present invention.

The test data storage unit 220 can operate according to two schemes.

The first scheme is a scheme for a case where the test data storage unit 220 has a minimum storage space.

Specifically, a test data storage space (not shown) capable of storing the test data TS_DATA is provided inside the test data storage unit 220, and the test data storage unit 220 stores the test data TS_DATA inputted from the mode configuration line MD_CONF_LINE in response to the test write command TS_WRITE. Likewise, the test data storage unit 220 outputs the test data TS_DATA stored in the test data storage space through the global line GIO_LINE in response to the test read command TS_READ. At this time, the test write command TS_WRITE and the test read command TS_READ are not activated when the test entry control signal TS_SEL is in a deactivated state. Thus, no data can be stored in the test data storage unit 220 when the integrated circuit operates in the normal operation mode.

That is, the test data storage unit 220 in accordance with the first scheme operates so that one address signal ADDR is stored as one test data TS_DATA in such a state where the test data storage unit 220 has a minimum storage space.

The second scheme is a scheme for a case where the test data storage unit 220 has a sufficient storage space.

Specifically, the test data storage unit 220 includes a plurality of test data storage spaces (not shown) which can be selected by a value of predetermined bits TD_SEL of the test data TS_DATA inputted through the mode configuration line MD_CONF_LINE, and can store the remaining bits TD_SAV, except for the predetermined bits TD_SEL. When the test write command TS_WRITE is activated, the test data storage unit 220 selects one storage space among the plurality of test data storage spaces according to the predetermined bits TD_SEL of the test data TS_DATA, and stores the remaining bits TD_SAV of the test data TS_DATA in the selected storage space. Likewise, when the test read command TS_READ is activated, the test data storage unit 220 outputs the value stored in the storage space selected among the plurality of test data storage spaces through the global line GIO_LINE according to the predetermined bits TD_SEL of the test data TS_DATA. At this time, the predetermined bits TS_DATA of the test data TS_DATA inputted together with the test read command TS_READ is used to select the data storage space. However, the remaining bits TD_SAV of the test data TS_DATA are discarded without being used. In addition, the test write command TS_WRITE and the test read command TS_READ are not activated when the test entry control signal TS_SEL is in a deactivated state. Thus, no data is to be stored in the test data storage unit 220 when the integrated circuit operates in the normal operation mode.

That is, the test data storage unit 220 in accordance with the second scheme operates so that the test data storage unit 220 performs an operation of separately storing several address signals ADDR as several test data TS_DATA in such a state where it has a sufficient storage space.

The test data storage unit 220 may be any reasonably suitable element corresponding to the MPR which stores pattern data including an MPR which performs a minimum read/write operation in accordance with the second embodiment of the present invention.

The connection selection unit 240 connects the data input/output terminal of the normal data storage unit 200 to the global line GIO_LINE in the normal operation mode and connects the data output terminal of the test data storage unit 220 to the global line GIO_LINE in the test operation mode.

Specifically, when the test entry control signal TS_SEL used to select the normal operation mode or the test operation mode is deactivated to a logic low level, the integrated circuit enters the normal operation mode and the connection selection unit 240 allows the normal data NR_DATA to be inputted/outputted between the normal data storage unit 200 and the global line GIO_LINE.

Likewise, when the test entry control signal TS_SEL is activated to a logic high level, the integrated circuit enters the test operation mode and the connection selection unit 240 allows the test data TS_DATA stored in the test data storage unit 220 to be outputted through the global line GIO_LINE.

In the deactivation period of the test entry control signal TS_SEL, the mode configuration control unit 210 generates the mode configuration code MD_CONF in response to the address signal ADDR loaded on the address input line ADDR_LINE, and transfers the mode configuration code MD_CONF to the internal circuit 230 through the mode configuration line MD_CONF_LINE. In addition, in the activation period of the test entry control signal TS_SEL, the mode configuration control signal 210 loads the address signal ADDR of the address input line ADDR_LINE on the mode configuration line MD_CONF_LINE as the test data TS_DATA, and transfers the loaded address signal ADDR to the test data storage unit 220.

Specifically, the mode configuration control unit 210 can allow the signal loaded on the mode configuration line MD_CONF_LINE to be used as two purposes by using the address signal ADDR loaded on the address input line ADDR_LINE.

That is, in the normal operation mode in which the test entry control signal TS_SEL is deactivated to a logic low level, the mode configuration control unit 210 performs an operation of newly defining the value of the mode configuration code MD_CONF in correspondence to the address signal ADDR loaded on the address input line ADDR_LINE. The mode configuration code MD_CONF whose value is newly defined is transferred through the mode configuration line MD_CONF_LINE to a plurality of circuits provided inside the integrated circuit. Thus, the plurality of circuits provided inside the integrated circuit can be newly set. The operation of setting the operation mode by transferring the mode configuration code MD_CONF to the internal circuit 230 through the mode configuration line MD_CONF_LINE may be any reasonably suitable operation for performing such a task.

On the other hand, in the test operation mode in which the test entry control signal TS_SEL is activated to a logic high level, the address signal ADDR loaded on the address input line ADDR_LINE is outputted as the test data TS_DATA. The test data TS_DATA having the same value as that of the address signal ADDR is transferred to the test data storage unit 220 through the mode configuration line MD_CONF_LINE. The test data TS_DATA is stored in the test data storage unit 220 and then outputted through the global line GIO_LINE. The operation of transferring the test data TS_DATA through the mode configuration line MD_CONF_LINE to the test data storage unit 220 and storing the value of the test data TS_DATA in the test data storage unit 220 may be any reasonably suitable operation for performing such a task.

Figure 3A:
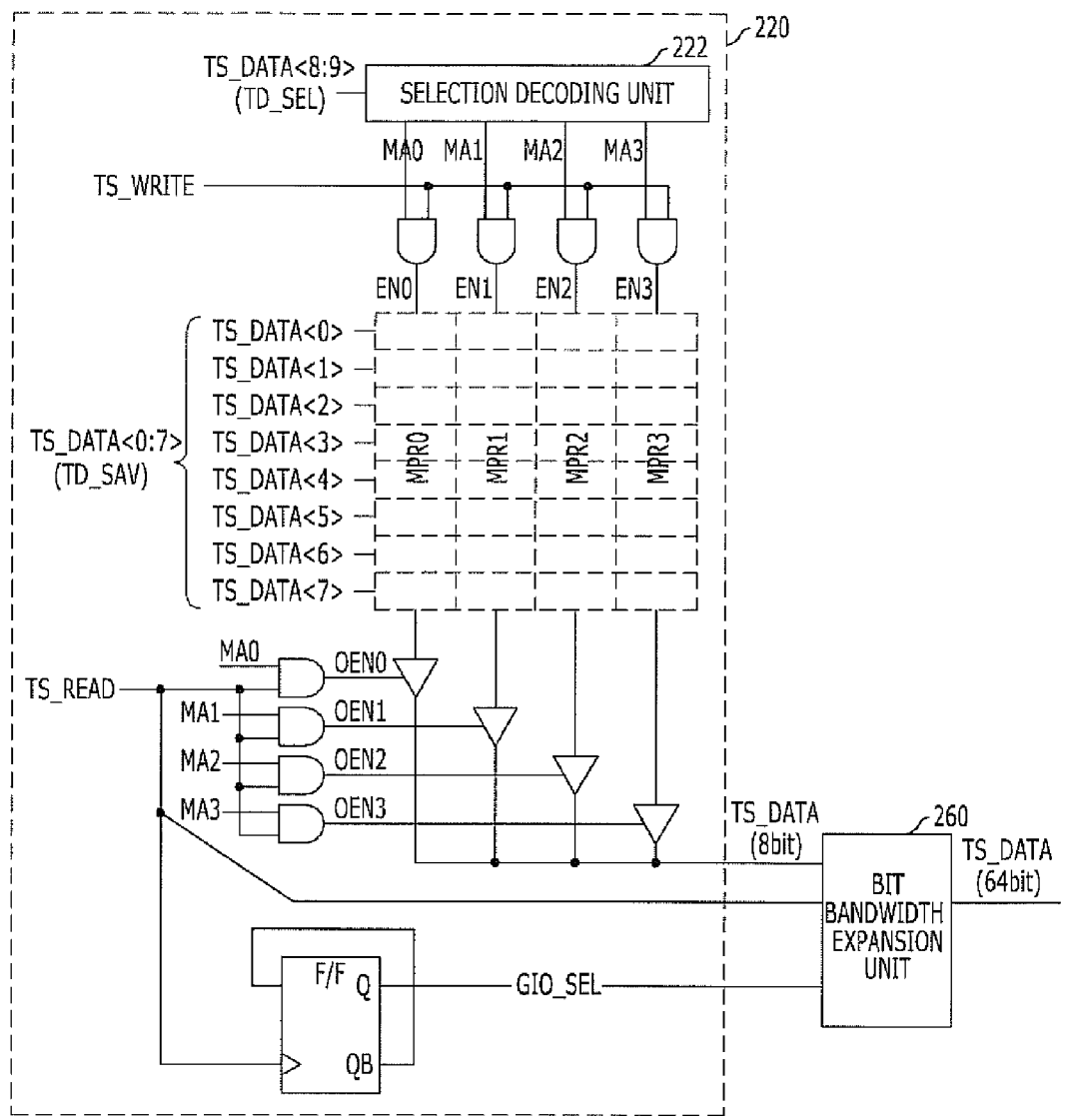
FIG. 3A is a detailed circuit diagram illustrating a test data storage unit of the MPR operation circuit in the integrated circuit of FIG. 2 in accordance with the second embodiment of the present invention.
Figure 3B:
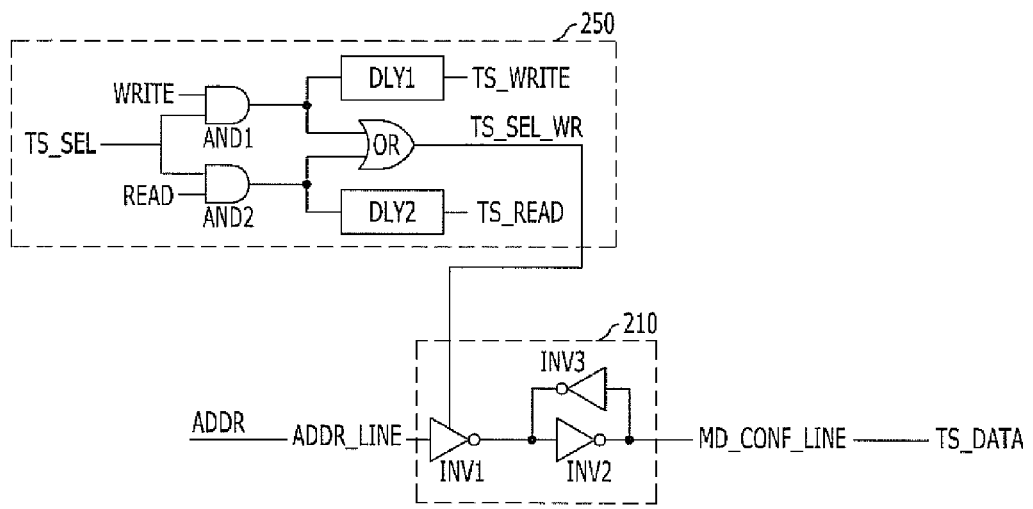
FIG. 3B is a detailed circuit diagram illustrating a test command generation unit and a mode configuration control unit of the MPR operation circuit in the integrated circuit of FIG. 2 in accordance with the second embodiment of the present invention.

FIG. 3A is a detailed circuit diagram illustrating the test data storage unit (for example, 220 in FIG. 2) of the MPR operation circuit in the integrated circuit of FIG. 2 in accordance with the second embodiment of the present invention.

For reference, FIG. 3A illustrates the test data storage unit 220 based on the second scheme in accordance with the second embodiment of the present invention.

Referring to FIG. 3A, the test data storage unit 220 includes zeroth to third MPR latches MPR0, MPR1, MPR2 and MPR3 corresponding to the plurality of test data storage spaces.

Eighth and ninth bits TS_DATA<8:9> of the test data TS_DATA corresponding to the predetermined bits TD_SEL of the test data TS_DATA inputted through the mode configuration line MD_CONF_LINE are inputted to a selective decoding unit 222 to generate latch selection control signals MA0, MA1, MA2, and MA3 for selecting any one of the zeroth to third MPR latches MPR0, MPR1, MPR2 and MPR3. Since only one of the zeroth to third MPR latches MPR0, MPR1, MPR2 and MPR3 is selected, only one of the latch selection control signals MA0, MA1, MA2, and MA3 is activated to a logic high level, and the others are deactivated to a logic low level.

When the test write command TS_WRITE is activated to a logic high level, the latch selection control signals MA0, MA1, MA2, and MA3 activate latch selection storage enable signals EN1, EN2, EN3 and EN4 to a logic high level or deactivate the latch selection storage enable signals EN1, EN2, EN3 and EN4 to a logic low level. Thus, the operation of selecting any one of the zeroth to third MPR latches MPR0, MPR1, MPR2 and MPR3 in order to store the test data TS_DATA can be performed.

Zeroth to seventh bits TS_DATA<0:7> of the test data TS_DATA corresponding to the remaining bits TD_SAV of the test data TS_DATA inputted through the mode configuration line MD_CONF_LINE are applied to the zeroth to third MPR latches MPR0, MPR1, MPR2 and MPR3. That is, the zeroth to seventh bits TS_DATA<0:7> of the test data TS_DATA are inputted to and stored in any one MPR latch selected by the latch selection storage enable signals EN1, EN2, EN3 and EN4 among the zeroth to third MPR latches MPR0, MPR1, MPR2 and MPR3, and no bits are stored in the unselected MPR latches.

In addition, each of the zeroth to third MPR latches MPR0, MPR1, MPR2 and MPR3 includes a bit latch configured to store 8 bits. Thus, the zeroth to seventh bits TS_DATA<0:7> of the test data TS_DATA can be simultaneously stored. Here, different circuit configurations may be used to accommodate a number of bits other than 8 bits for TS_DATA.

The latch selection control signals MA0, MA1, MA2, and MA3 generated by the selective decoding unit 222 enable the operation of selecting any one of the zeroth to third MPR latches MPR0, MPR1, MPR2 and MPR3 in order to output the test data stored in the zeroth to third MPR latches MPR0, MPR1, MPR2 and MPR3 by activating selection output enable signals OEN0, OEN1, OEN2, and OEN3 to a logic high level or deactivating the selection output enable signals OEN0, OEN1, OEN2, and OEN3 to a logic low level when the test read command TS_READ is activated to a logic high level.

The test data stored in the MPR latch selected by the selection output enable signals OEN0, OEN1, OEN2, and OEN3 among the zeroth to third MPR latches MPR0, MPR1, MPR2 and MPR3 are applied to the bit bandwidth expansion unit 260, converted into the same bit bandwidth as that of the global line GIO_LINE (8 bits→64 bits), and then, outputted through the global line GIO_LINE.

In addition, when the test read command TS_READ is activated to a logic high level and any one of the zeroth to third MPR latches MPR0, MPR1, MPR2 and MPR3 is selected, the test write command TS_WRITE is in a deactivate state of a logic low level. Therefore, the zeroth to seventh bits TS_DATA<0:7> of the test data TS_DATA corresponding to the remaining bits TD_SAV of the test data TS_DATA are not stored in any one of the zeroth to third MPR latches MPR0, MPR1, MPR2 and MPR3. That is, when the test read command TS_READ is activated, the zeroth to seventh bits TS_DATA<0:7> of the test data TS_DATA corresponding to the remaining bits TD_SAV of the test data TS_DATA have no meaning and are discarded without being used.

The test read command TS_READ and a signal "GIO_SEL" are further inputted to the bit bandwidth expansion unit 260 together with the test data TS_DATA. The test read command TS_READ is inputted to the bit bandwidth expansion unit 260 in order to limit the operation period of the bit bandwidth expansion unit 260 to the activation period of the test read command TS_READ. In addition, the signal GIO_SEL is inputted to the bit bandwidth expansion unit 260 in order to be used as a copy reference signal because the bit bandwidth expansion unit 260 uses a method of expanding the bit bandwidth by copying the inputted test data TS_DATA (8 bits) by a preset number of times. Referring again to FIG. 2, the signal GIO_SEL is not shown to be inputted to the bit bandwidth expansion unit 260. This is because the use of the signal GIO_SEL is optional.

As can be seen from the procedure of determining logic level values of selection input enable signals EN0, EN1, EN2 and EN3 and the selection output enable signals OEN0, OEN1, OEN2, and OEN3 by the latch selection control signals MA0, MA1, MA2, and MA3, the test data storage unit 220 cannot perform the operation of storing the test data TS_DATA if the test write command TS_WRITE is not activated, and cannot perform the operation of outputting the test data TS_DATA if the test read command TS_READ is not activated. Therefore, in the normal operation mode of the integrated circuit in which the test write command TS_WRITE and the test read command TS_READ cannot be activated, no data can be stored in the test data storage unit 220 and no data can be outputted from the test data storage unit 220.

FIG. 3B is a detailed circuit diagram illustrating the test command generation unit and the mode configuration control unit of the MPR operation circuit in the integrated circuit of FIG. 2 in accordance with the second embodiment of the present invention.

Referring to FIG. 3B, the test command generation unit 250 of the MPR operation circuit in the integrated circuit in accordance with the second embodiment of the present invention includes a first AND gate AND1, a second AND gate AND2, a first delay DLY1, a second delay DLY2, an OR gate OR. The first AND gate AND1 receives the write command WRITE through a first input terminal and the test entry control signal TS_SEL through a second input terminal, and performs an AND operation on the write command WRITE and the test entry control signal TS_SEL. The second AND gate AND2 receives the read command READ through a first input terminal and the test entry control signal TS_SEL through a second input terminal, and performs an AND operation on the read command READ and the test entry control signal TS_SEL. The first delay DLY1 delays an output signal of the first AND gate AND1 by a set time and outputs the test write command TS_WRITE. The second delay DLY2 delays an output signal of the second AND gate AND2 by a set time and outputs the test read command TS_READ. The OR gate OR receives the output signal of the first AND gate AND1 through a first input terminal and the output signal of the second AND gate AND2 through a second input terminal, performs an OR operation on the output signal of the first AND gate AND1 and the output signal of the second AND gate AND2, and generates a write/read test entry control signal TS_SEL_WR.

The mode configuration control unit 210 of the MPR operation circuit in the integrated circuit in accordance with the second embodiment of the present invention a first inverter INV1, a second inverter INV2, and a third inverter INV3. The first inverter INV1 performs an on/off control operation of transferring the address signal ADDR, which is inputted through the address input line ADDR_LINE, as the test data TS_DATA through the mode configuration line MD_CONF_LINE in response to the write/read test entry control signal TS_SEL_WR. The second inverter INV2 and the third inverter INV3 are connected in a latch configuration in order to prevent a floating of a voltage level of the test data TS_DATA loaded on the mode configuration line MD_CONF_LINE. In the mode configuration control unit 210, only the configuration which transfers the address signal ADDR as the test data TS_DATA is disclosed, but the configuration that generates the mode configuration code MD_CONF in response to the address signal ADDR is not disclosed. Since the configuration which generates the mode configuration code MD_CONF in response to the address signal ADDR is well known, a detailed circuit configuration thereof is omitted. That is, the real configuration of the mode configuration control unit 210 includes a circuit which is more complicated than the circuit illustrated in FIG. 3.

Figure 3C:
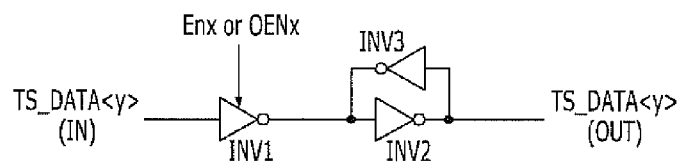
FIG. 3C is a detailed circuit diagram illustrating an MPR latch of the test data storage unit of FIG. 3A.

FIG. 3C is a detailed circuit diagram illustrating the MPR latch of the test data storage unit of FIG. 3A.

Referring to FIG. 3C, each of the zeroth to third MPR latches MPR0, MPR1, MPR2 and MPR3 illustrated in FIG. 3A includes a bit latch configured to store eight bits. A single bit latch which can store 1 bit is illustrated in FIG. 3C.

Specifically, the MPR latch includes a first inverter INV1, a second inverter INV2, and a third inverter INV3. The first inverter INV1 controls the transferring of an arbitrary 1 bit TS_DATA<y> among the zeroth to seventh bits TS_DATA<0:7> corresponding to the remaining bits TD_SAV of the inputted test data TS_DATA in response to an arbitrary enable signal ENx or OENx among the selection input enable signals EN0, EN1, EN2 and EN3 or the selection output enable signals OEN0, OEN1, OEN2, and OEN3. The second inverter INV2 and the third inverter INV3 are connected in a latch configuration in order to prevent a floating of a value of the arbitrary 1 bit TS_DATA<y> transferred from the first inverter INV1.

Figure 4:
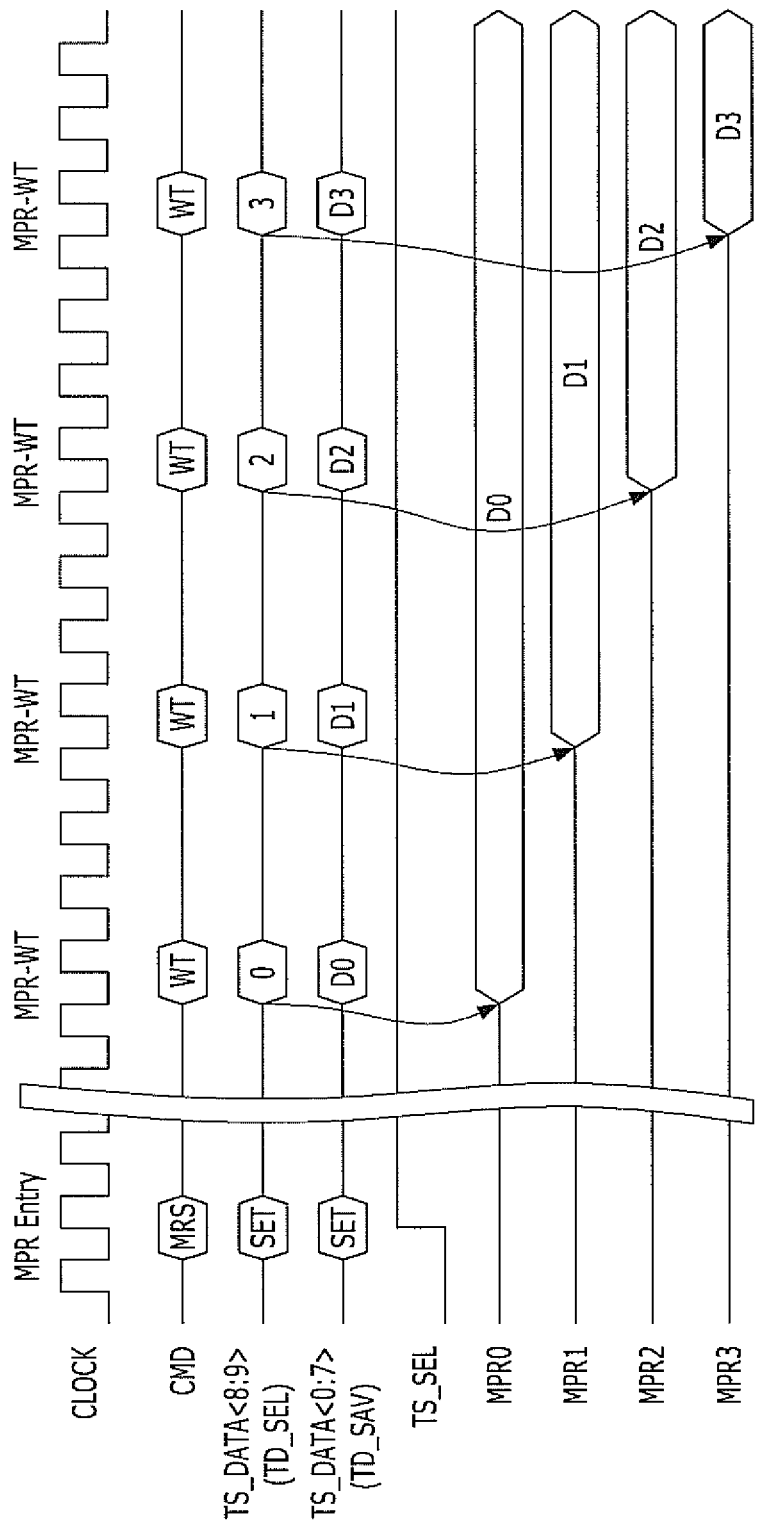
FIG. 4 is a timing diagram illustrating a data write operation of the MPR operation circuit in the integrated circuit of FIG. 2 in accordance with the second embodiment of the present invention.

FIG. 4 is a timing diagram illustrating a data write operation of the MPR operation circuit in the integrated circuit of FIG. 2 in accordance with the second embodiment of the present invention.

Referring to FIG. 4, the data write operation of the MPR operation circuit in the integrated circuit in accordance with the embodiment of the present invention starts when the test entry control signal TS_SEL is activated for the entry into the test operation mode.

When the write command WRITE (WT) is inputted while the test entry control signal TS_SEL is in an activated state, any one of the zeroth to third MPR latches MPR0, MPR1, MPR2 and MPR3 is selected by the eighth and ninth bits TS_DATA<8:9> of the test data TS_DATA corresponding to the predetermined bits TD_SEL of the test data TS_DATA. At the same time, the values of the zeroth to seventh bits TS_DATA<0:7> of the test data TS_DATA, which correspond to the remaining bits TD_SAV of the test data TS_DATA, are stored as the test data in any one selected among the zeroth to third MPR latches MPR0, MPR1, MPR2 and MPR3.

For reference, in the timing diagram of FIG. 4, the zeroth MPR latch MPR0 among the zeroth to third MPR latches MPR0, MPR1, MPR2 and MPR3 is first selected and stores the test data TS_DATA. Then, the first MPR latch MPR1 is selected and stores the test data TS_DATA. Next, the second MPR latch MPR2 is selected and stores the test data TS_DATA. Finally, the third MPR latch MPR3 is selected and stores the test data TS_DATA.

Figure 5:
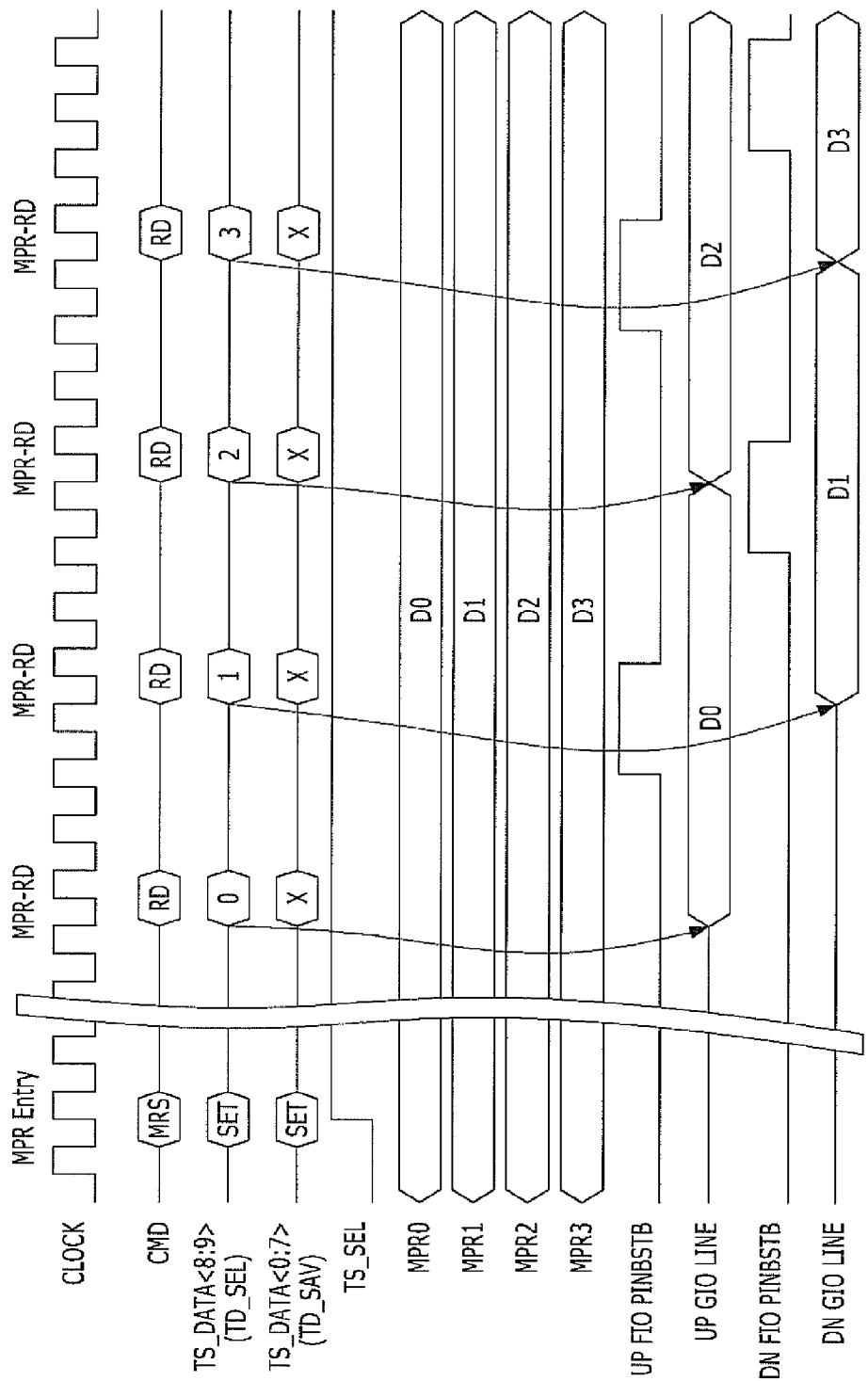
FIG. 5 is a timing diagram illustrating a data read operation of the MPR operation circuit in the integrated circuit of FIG. 2 in accordance with the second embodiment of the present invention.

FIG. 5 is a timing diagram illustrating a data read operation of the MPR operation circuit in the integrated circuit of FIG. 2 in accordance with the second embodiment of the present invention.

Referring to FIG. 5, as in the data write operation, the data read operation of the MPR operation circuit in the integrated circuit in accordance with the embodiment of the present invention starts when the test entry control signal TS_SEL is activated for the entry into the test operation mode.

However, in the data read operation, the test data TS_DATA (D0, D1, D2, D3) have already been stored in the zeroth to third MPR latches MPR0, MPR1, MPR2 and MPR3, as opposed to the data write operation.

When the read command READ (RD) is inputted when the test entry control signal TS_SEL is in an activated state, any one of the zeroth to third MPR latches MPR0, MPR1, MPR2 and MPR3 is selected by the eighth and ninth bits TS_DATA<8:9> of the test data TS_DATA corresponding to the predetermined bits TD_SEL of the test data TS_DATA. At the same time, the values of the zeroth to seventh bits TS_DATA<0:7> of the test data TS_DATA, which correspond to the remaining bits TD_SAV of the test data TS_DATA, are discarded without being used (X).

AS such, the MPR latch selected among the zeroth to third MPR latches MPR0, MPR1, MPR2 and MPR3 by the read command READ (RD) outputs the stored test data TS_DATA (D0, D1, D2, D3) through the global line GIO_LINE.

Referring to the timing diagram of FIG. 5, in such a state where the global line GIO_LINE is divided into an up global line UP_GIO_LINE and a down global line DN_GIO_LINE, the test data TS_DATA (D0, D1, D2, D3) stored in the MPR latch selected among the zeroth to third MPR latches MPR0, MPR1, MPR2 and MPR3 are sequentially outputted in turns. Thus, a window interval of the test data TS_DATA (D0, D1, D2, D3) loaded on the global line GIO_LINE (UP_GIO_LINE, DN_GIO_LINE) can be expanded to be longer than an input period of the read command READ (RD). As such, the reason why the global line GIO_LINE are divided into the up global line UP_GIO_LINE and the down global line DN_GIO_LINE and the operation of expanding the window interval of the test data TS_DATA (D0, D1, D2, D3) loaded on the global line GIO_LINE (UP_GIO_LINE, DN_GIO_LINE) is to realize a very high speed integrated circuit while obtaining adequate window intervals. That is, the integrated circuit operating at a high speed usually divides the global line GIO_LINE into the up global line UP_GIO_LINE and the down global line DN_GIO_LINE. In such a case, the test data may be outputted as illustrated in the timing diagram of FIG. 5.

The timing diagram of FIG. 5 is merely applied to the case in which the global line GIO_LINE is divided into the up global line UP_GIO_LINE and the down global line DN_GIO_LINE. In the case in which the global line GIO_LINE is not divided into the up global line UP_GIO_LINE and the down global line DN_GIO_LINE, the test data TS_DATA (D0, D1, D2, D3) having a window interval shorter than the window interval of the test data TS_DATA (D0, D1, D2, D3) illustrated in FIG. 5 are successively outputted through the single global line GIO_LINE. Different configurations may also be used according to different design needs.

For reference, in the timing diagram of FIG. 5, the zeroth MPR latch MPR0 among the zeroth to third MPR latches MPR0, MPR1, MPR2 and MPR3 is first selected and outputs the stored test data TS_DATA (D0) through the up global line UP_GIO_LINE. Then, the first MPR latch MPR1 is selected and outputs the stored test data TS_DATA (D1) through the down global line DN_GIO_LINE. Next, the second MPR latch MPR2 is selected and outputs the stored test data TS_DATA (D2) through the up global line UP_GIO_LINE. Finally, the third MPR latch MPR3 is selected and outputs the stored test data TS_DATA (D3) through the down global line DN_GIO_LINE.

If the global line GIO_LINE is not divided into the up global line UP_GIO_LINE and the down global line DN_GIO_LINE, the operation will be changed as follows. First, the zeroth MPR latch MPR0 among the zeroth to third MPR latches MPR0, MPR1, MPR2 and MPR3 is selected and outputs the stored test data TS_DATA (D0) through the global line GIO_LINE. Then, the first MPR latch MPR1 is selected and outputs the stored test data TS_DATA (D1) through the global line GIO_LINE. Next, the second MPR latch MPR2 is selected and outputs the stored test data TS_DATA (D2) through the global line GIO_LINE. Finally, the third MPR3 is selected and outputs the stored test data TS_DATA (D3) through the global line GIO_LINE.

The MPR operation circuit of the integrated circuit in accordance with the second embodiment of the present invention is different from the MPR operation circuit of the integrated circuit in accordance with the first embodiment of the present invention in that the test command generation unit 250 and the mode configuration control unit 210 are further included.

The following description will be given on the operation of the MPR operation circuit of the integrated circuit in accordance with the second embodiment of the present invention, which is different from the operation of the MPR operation circuit of the integrated circuit in accordance with the first embodiment of the present invention due to the addition of the test command generation unit 250 and the mode configuration control unit 210.

It has been described above that the operation of transferring the mode configuration code MD_CONF to the internal circuit 230 through the mode configuration line MD_CONF_LIEN in the mode configuration control unit 210 is well known. Here, the mode configuration line MD_CONF_LINE is a well known component used for performing such an operation.

More specifically, the address input line ADDR_LINE is used to transfer the address signal ADDR between the address input pad and the address decoder, and the decoded address signal outputted from the address decoder is merely transferred to the normal data storage unit 100. Therefore, in order to transfer the address signal ADDR loaded on the address input line ADDR_LINE to the test data storage unit 120 as in the case of the first embodiment of the present invention, it is necessary to further extend the address input line ADDR_LINE or provide a new line.

However, as in the case of the second embodiment, if the address signal ADDR is converted into the test data TS_DATA and transferred through the mode configuration line MD_CONF_LINE which is already present, it is unnecessary to further extend the address input line or install a new line. In this case, the test write command TS_WRITE and the test read command TS_READ generated from the test command generation unit 250 are command which are used only in the second embodiment. Thus, it is necessary to install an additional line for transferring the test write command TS_WRITE and the test read command TS_READ to the test data storage unit 220. However, as compared to the multi-bit test data TS_DATA, the test write command TS_WRITE and the test read command TS_READ have mere 1-bit information. Therefore, the additional line installation does not significantly increase the area of the integrated circuit.

Therefore, when the operation using the mode configuration control unit 210 in accordance with the second embodiment of the present invention is applied to the integrated circuit, the area of the integrated circuit does not greatly increase.

As described above, when the second embodiment of the present invention is applied, the test data TS_DATA stored in the test data storage unit 220 corresponding to the MPR is applied to the semiconductor system through the mode configuration line MD_CONF_LINE and the stored value of the MPR is variable through the semiconductor system. Thus, it is possible to obtain adequate input/output characteristics of the MPR.

In addition, since the test data TS_DATA is inputted through the mode configuration line MD_CONF_LINE which is already present, it is unnecessary to provide an additional line for receiving the test data TS_DATA. Accordingly, the area of the integrated circuit can be minimally maintained.

<Third Embodiment>

Figure 6A:
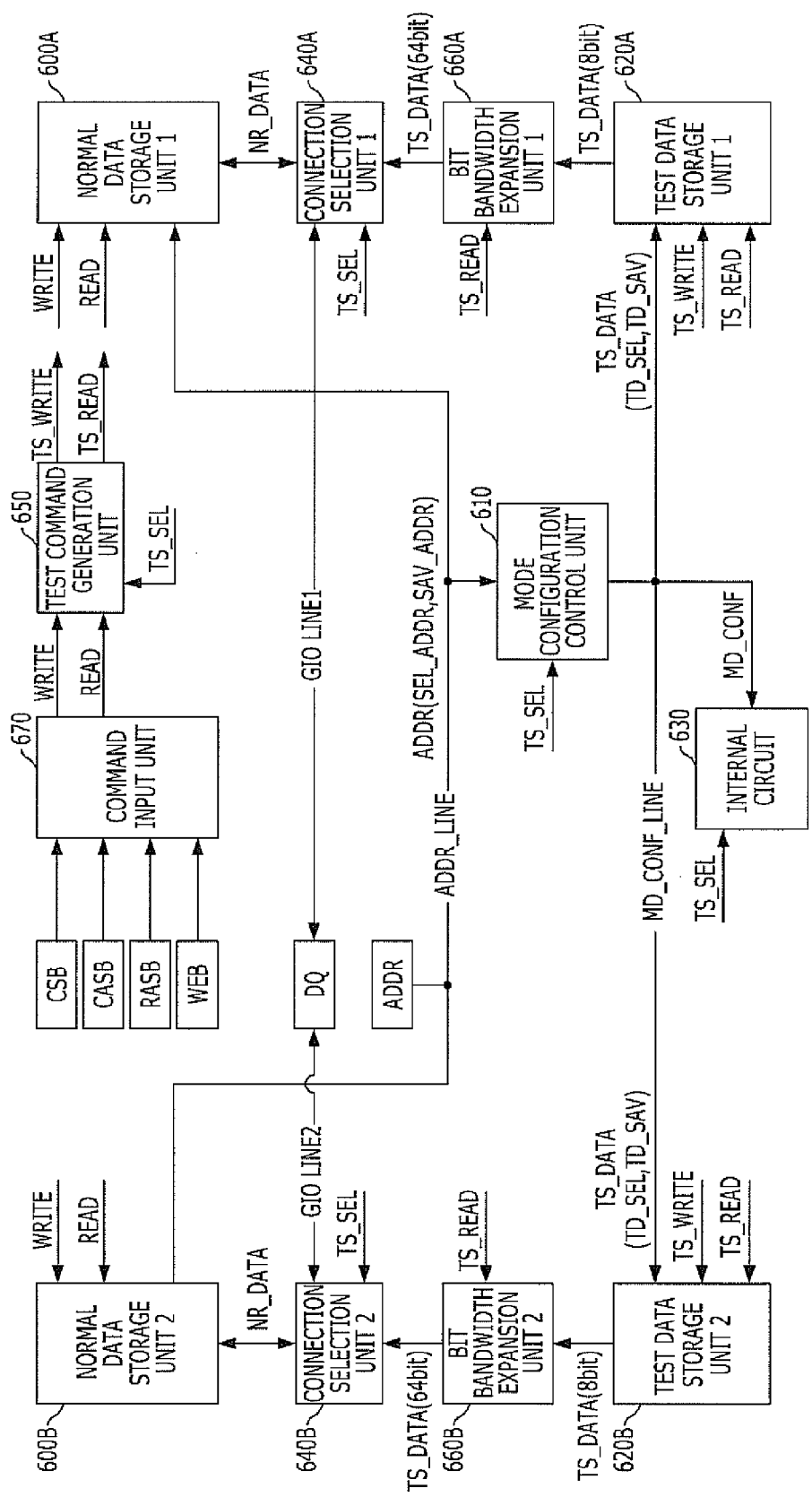
FIGS. 6A and 6B are block diagrams illustrating the configuration of an MPR operation circuit in an integrated circuit in accordance with a third embodiment of the present invention.
Figure 6B:
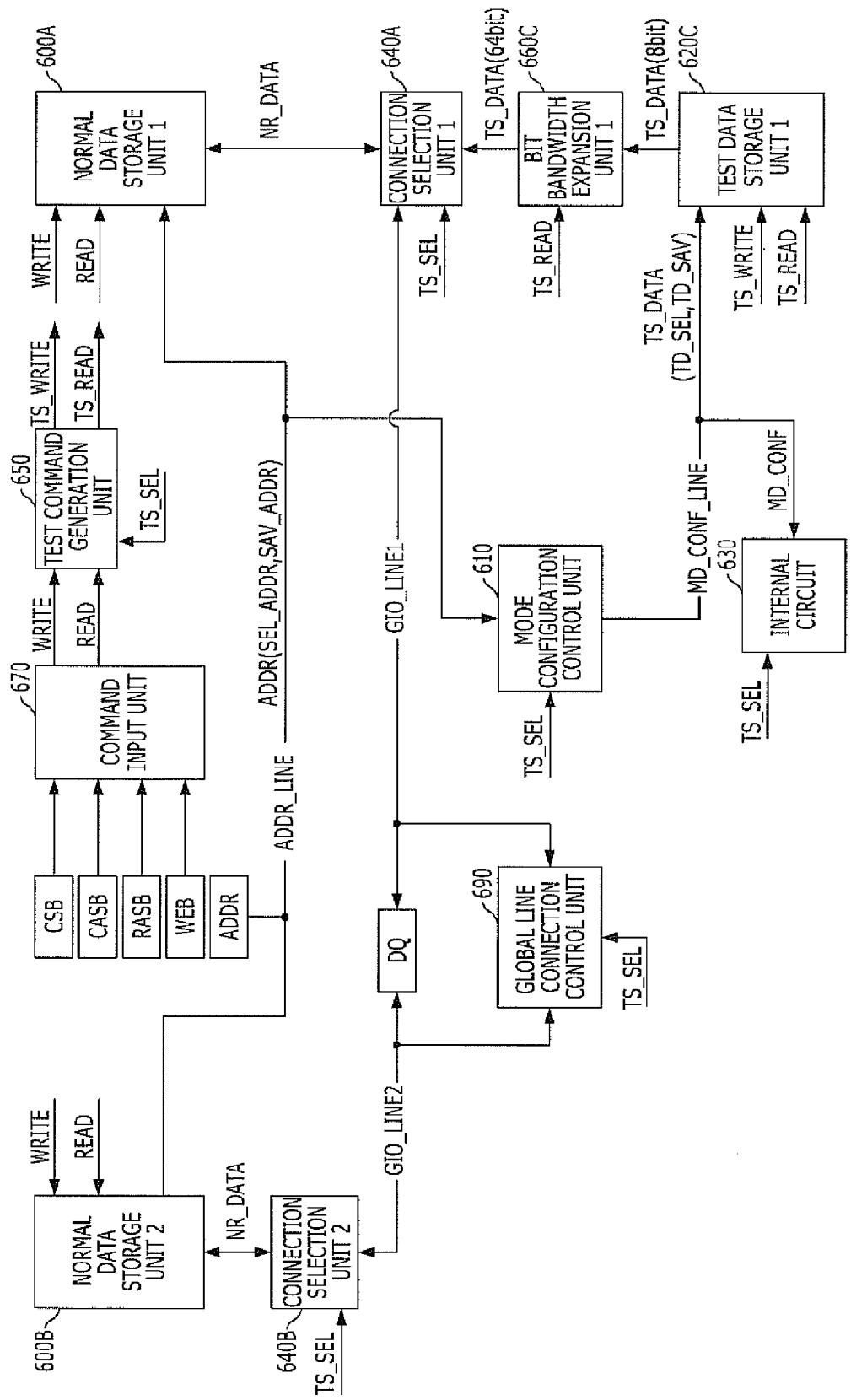

FIGS. 6A and 6B are block diagrams illustrating the configuration of an MPR operation circuit in an integrated circuit in accordance with a third embodiment of the present invention.

Referring to FIG. 6A, the MPR operation circuit in the integrated circuit in accordance with the third embodiment of the present invention includes an address input line ADDR_LINE, a mode configuration control unit 610, test data storage units 620A and 620B, and an internal circuit 630. The address input line ADDR_LINE is configured to receive an address signal. The mode configuration control unit 610 outputs the address signal ADDR, which is inputted through the address input line ADDR_LINE, to a mode configuration line MD_CONF_LINE as test data TS_DATA or mode configuration code MD_CONF in response to a test entry control signal TS_SEL. The test data storage units 620A and 620B store the test data TS_DATA inputted through the mode configuration line MD_CONF_LINE in response to a test write command TS_WRITE, and output the stored test data TS_DATA through a first global line GIO_LINE_1 or a second global line GIO_LINE_2 in response to a test read command TS_READ. The internal circuit 630 is configured to set to a preset internal operation mode in response to the test entry control signal TS_SEL and the mode configuration code MD_CONF inputted through the mode configuration line MD_CONF_LINE.

In addition, the MPR operation circuit further includes a first normal data storage unit 600A and a second normal data storage unit 600B. The first normal data storage unit 600A stores normal data NR_DATA inputted through the first global line GIO_LINE_1 in response to a write command WRITE, a read command READ, and an address signal ADDR, and outputs the stored normal data NR_DATA through the first global line GIO_LINE_1. The second normal data storage unit 600B stores normal data NR_DATA inputted through the second global line GIO_LINE_2 in response to the write command WRITE, the read command READ, and the address signal ADDR, and outputs the stored normal data NR_DATA through the second global line GIO_LINE_2.

Furthermore, the MPR operation circuit further includes connection selection units 640A and 640B. The connection selection units 640A and 640B selectively connect the first and second normal data storage units 600A and 600B and the first and second test data storage units 620A and 620B to the first and second global lines GIO_LINE_1 and GIO_LINE_2 in response to the test entry control signal TS_SEL.

In addition, the MPR operation circuit further includes a command input unit 670 which receives a chip select signal CSB, a column strobe signal CASB, a row strobe signal RASB, and a write enable signal WEB, and generates the write command WRITE and the read command READ.

The first test data storage unit 620A stores the test data TS_DATA inputted through the mode configuration line MD_CONF_LINE in response to the test write command TS_WRITE, and outputs the stored test data TS_DATA through the first global line GIO_LINE_1 in response to the test read command TS_READ. The second test data storage unit 620B stores the test data TS_DATA inputted through the mode configuration line MD_CONF_LINE in response to the test write command TS_WRITE, and outputs the stored test data TS_DATA through the second global line GIO_LINE_2 in response to the test read command TS_READ.

Since the test data storage units 620A and 620B include the first test data storage unit 620A and the second test data storage unit 620B, the connection selection units 640A and 640B include the first connection selection unit 640A and the second connection selection unit 640B. The first connection selection unit 640A selectively connects the first normal data storage unit 600A and the first test data storage unit 620A to the first global line GIO_LINE_1 in response to the test entry control signal TS_SEL. The second connection selection unit 640B selectively connects the second normal data storage unit 600B and the second test data storage unit 620B to the second global line GIO_LINE_2 in response to the test entry control signal TS_SEL.

In addition, the MPR operation circuit further includes a test command generation unit 650 which generates the test write command TS_WRITE in response to the test entry control signal TS_SEL and the write command WRITE, and generates the test read command TS_READ in response to the test entry control signal TS_SEL and the read command READ.

In addition, the MPR operation circuit further includes bit bandwidth expansion units 660A and 660B which expand a bit bandwidth (8 bits) of the test data TS_DATA, outputted through the data output terminal of the test data storage units 620A and 620B when the test read command TS_READ is activated, to a set value to thereby make the bit bandwidth equal to a bit bandwidth of the first and second global lines GIO_LINE_1 and GIO_LINE_2.

At this time, since the test data storage units 620A and 620B include the first test data storage unit 620A and the second test data storage unit 620B and the connection selection units 640A and 640B include the first connection selection unit 640A and the second connection selection unit 640B, the bit bandwidth expansion units 660A and 660B include the first bit bandwidth expansion unit 660A, which expands the bit bandwidth of the test data TS_DATA outputted through the data output terminal of the first test data storage unit 620A, and the second bit bandwidth expansion unit 660B, which expands the bit bandwidth of the test data TS_DATA outputted through the data output terminal of the second test data storage unit 620B.

The MPR operation circuit further includes a data input/output pad DQ which is commonly connected to the first global line GIO_LINE_1 and the second global line GIO_LINE_2 and through which the normal data NR_DATA is inputted/outputted or the test data TS_DATA is outputted.

For reference, although it is illustrated in FIG. 6A as if the test command generation unit 650 and the mode configuration control signal 610 are separated from each other and individually perform their operations, such an illustration is used for purposes of providing clarity. The same elements can also be grouped as a single element for performing the above described functions.

In addition, in implementation, the operations of the test command generation unit 650 and the mode configuration control unit 610 may be defined in a mode register set (MRS). Therefore, a combination of the test command generation unit 650 and the mode configuration control unit 610 is illustrated in FIG. 3B.

The first global line GIO_LINE_1 and the second global line GIO_LINE_2 share the data input/output pad DQ. Such a scheme is usually used when the first normal data storage unit 600A and the second normal data storage unit 600B are disposed at opposite positions with respect to the data input/output pad DQ. This scheme may be used in memory product groups operating at a high speed.

The operation of the respective elements of the MPR operation circuit in the integrated circuit in accordance with the third embodiment of the present invention will be described in detail below.

The bit bandwidth expansion units 660A and 660B are provided because the data bandwidth of the address input line ADDR_LINE and the data bandwidth of the first global line GIO_LINE_1 and the second global line GIO_LINE_2 differ from each other and, in general, the data bandwidth of the first global line GIO_LINE_1 and the second global line GIO_LINE_2 is greater than the data bandwidth of the address input line ADDR_LINE. That is, the test data TS_DATA are inputted to the test data storage units 620A and 620B through the address input line ADDR_LINE, and the test data TS_DATA stored in the test data storage units 620A and 620B are outputted through the first and second global lines GIO_LINE_1 and GIO_LINE_2.

Therefore, the bit bandwidth expansion units 660A and 6608 perform an operation of converting the test data TS_DATA (8 bits) having a small data bandwidth into the test data TS_DATA (64 bits) having a large data bandwidth. A method of repeatedly copying the same data may be used. For example, the test data TS_DATA (64 bits) having a larger data bandwidth is generated by copying the test data TS_DATA (8 bits) having a small data bandwidth eight times.

In an activation period of the test entry control signal TS_SEL, the test command generation unit 650 activates the test write command TS_WRITE when the write command WRITE is activated, and deactivates the test write command TS_WRITE when the write command WRITE is deactivated. Likewise, in the activation period of the test entry control signal TS_SEL, the test command generation unit 650 activates the test read command TS_READ when the read command READ is activated, and deactivates the test read command TS_READ when the read command READ is deactivated. In addition, in a deactivation period of the test entry control signal TS_SEL, the test command generation unit 650 deactivates the test write command TS_WRITE, regardless of whether or not the write command WRITE is activated. Likewise, in the deactivation period of the test entry control signal TS_SEL, the test command generation unit 650 deactivates the test read command TS_READ, regardless of whether or not the read command READ is activated.

The address signal ADDR inputted through the address input line ADDR_LINE includes a storage unit selection address signal SEL_ADDR and a storage space selection address signal SAV_ADDR. That is, in the third embodiment of the present invention, the element storing the normal data NR_DATA is not a single element but two elements, i.e., the first normal data storage unit 600A and the second normal data storage unit 600B. Thus, the address signal ADDR inputted through the address input line ADDR_LINE includes the storage unit selection address signal SEL_ADDR for selecting which one of the first normal data storage unit 600A and the second normal data storage unit 600B the normal data NR_DATA is to be stored in, and the storage space selection address signal SAV_ADDR for selecting which position the normal data NR_DATA is to be stored at within the selected normal data storage unit.

The first normal data storage unit 600A and the second normal data storage unit 600B can be any reasonably suitable element corresponding to a plurality of banks including banks which perform minimum read/write operations in accordance with the third embodiment of the present invention. In addition, the storage unit selection address signal SEL_ADDR may be any reasonably suitable signal corresponding to a bank address for selecting one of a plurality of banks, and the storage space selection address signal SAV_ADDR may be any reasonably suitable signal corresponding to a row/column address for selecting a cell to or from which real data is inputted or outputted in the bank selected by the bank address.

Specifically, the first normal data storage unit 600A includes a plurality of first normal data storage spaces (not shown) which can store the normal data NR_DATA. When the first normal data storage unit 600A is selected by the storage unit selection address signal SEL_ADDR in the deactivation period of the test entry control signal TS_SEL, the first normal data storage unit 600A selects any one storage space corresponding to the storage space selection address signal SAV_ADDR among the plurality of first normal data storage spaces, and stores the normal data NR_DATA inputted through the first global line GIO_LINE_1 in the selected data storage space, and outputs the normal data NR_DATA stored in the selected storage space through the first global line GIO_LINE_1 in response to the read command READ. However, when the first normal data storage unit 600A is not selected by the storage unit selection address signal SEL_ADDR in the activation or deactivation period of the test entry control signal TS_SEL, the first normal data storage unit 600A performs no read/write operation, regardless of whether or not the write command WRITE and the read command READ are activated.

The second normal data storage unit 600B includes a plurality of second normal data storage spaces (not shown) which can store the normal data NR_DATA. When the second normal data storage unit 600B is selected by the storage unit selection address signal SEL_ADDR in the deactivation period of the test entry control signal TS_SEL, the second normal data storage unit 600E selects any one storage space corresponding to the storage space selection address signal SAV_ADDR among the plurality of second normal data storage spaces, and stores the normal data NR_DATA inputted through the second global line GIO_LINE_2 in the selected data storage space, and outputs the normal data NR_DATA stored in the selected storage space through the second global line GIO_LINE_2 in response to the read command READ. However, when the second normal data storage unit 600B is not selected by the storage unit selection address signal SEL_ADDR in the activation or deactivation period of the test entry control signal TS_SEL, the second normal data storage unit 600B performs no read/write operation, regardless of whether or not the write command WRITE and the read command READ are activated.

The configuration of the first test data storage unit 620A and the second test data storage unit 620B can be divided into two schemes according to the operation thereof. For reference, since the first test data storage unit 620A and the second test data storage unit 620B have the same configuration, detailed description thereof will be focused on the first test data storage unit 620A.

The first scheme is a scheme for a case where the first test data storage unit 620A has a minimum storage space.

Specifically, a first test data storage space (not shown) capable of storing the test data TS_DATA is provided inside the first test data storage unit 620A, and the first test data storage unit 620A stores the test data TS_DATA inputted from the mode configuration line MD_CONF_LINE in response to the test write command TS_WRITE. Likewise, the first test data storage unit 620A outputs the test data TS_DATA stored in the test data storage space to the first global line GIO_LINE_1 and the second global line GIO_LINE_2 through a global line connection control unit 690 in response to the test read command TS_READ. At this time, the test write command TS_WRITE and the test read command TS_READ are not activated when the test entry control signal TS_SEL is in a deactivated state. Thus, no data can be stored in the first test data storage unit 620A when the integrated circuit operates in the normal operation mode.

That is, the first test data storage unit 620A in accordance with the first scheme operates so that one address signal ADDR is stored as one test data TS_DATA in such a state where the first test data storage unit 620A has a minimum storage space.

The second scheme is a scheme for a case where the first test data storage unit 620A has a sufficient storage space.

Specifically, the first test data storage unit 620A includes a plurality of first test data storage spaces (not shown) which can be selected by values of predetermined bits TD_SEL corresponding to the storage unit selection address signal SEL_ADDR among the test data TS_DATA inputted through the mode configuration line MD_CONF_LINE, and can store the remaining bits TD_SAV corresponding to the storage space selection address signal SAV_ADDR. When the test write command TS_WRITE is activated, the first test data storage unit 620A selects one storage space among the plurality of first test data storage spaces according to the predetermined bits TD_SEL of the test data TS_DATA, and stores the remaining bits TD_SAV of the test data TS_DATA in the selected storage space. Likewise, when the test read command TS_READ is activated, the first test data storage unit 620A outputs the value stored in the storage space selected among the plurality of first test data storage spaces to the first global line GIO_LINE_1 and the second global line GIO_LINE_2 through the global line connection control unit 690 according to the predetermined bits TD_SEL of the test data TS_DATA. At this time, the predetermined bits TS_DATA of the test data TS_DATA inputted together with the test read command TS_READ is used to select the data storage space. However, the remaining bits TD_SAV of the test data TS_DATA are discarded without being used. In addition, the test write command TS_WRITE and the test read command TS_READ are not activated when the test entry control signal TS_SEL is in a deactivated state. Thus, no data can be stored in the first test data storage unit 620A when the integrated circuit operates in the normal operation mode.

That is, the first test data storage unit 620A in accordance with the second scheme operates so that the first test data storage unit 620A performs an operation of separately storing several storage space selection address signals SEL_ADDR as several test data TS_DATA according to the storage unit selection address signal SEL_ADDR in such a state where it has a sufficient storage space.

As such, the first test data storage unit 620A may be any reasonably suitable element corresponding to the MPR which stores pattern data including an MPR which performs a minimum read/write operation in accordance with the third embodiment of the present invention.

In addition, the described-above configuration of the first test data storage unit 620A may be applied to the configuration of the second test data storage unit 620B.

The first connection selection unit 640A connects the data input/output terminal of the first normal data storage unit 600A to the first global line GIO_LINE_1 in the normal operation mode, and connects the data output terminal of the first test data storage unit 620A to the first global line GIO_LINE_1 in the test operation mode. Likewise, the second connection selection unit 640B connects the data input/output terminal of the second normal data storage unit 600B to the second global line GIO_LINE_2 in the normal operation mode, and connects the data output terminal of the second test data storage unit 620B to the second global line GIO_LINE_2 in the test operation mode.

Specifically, when the test entry control signal TS_SEL used to select the normal operation mode and the test operation mode is deactivated to a logic low level, the integrated circuit enters the normal operation mode and the first connection selection unit 640A allows the normal data NR_DATA to be inputted/outputted between the first normal data storage unit 600A and the first global line GIO_LINE_1, and allows the normal data NR_DATA to be inputted/outputted between the second normal data storage unit 600B and the second global line GIO_LINE_2.

Likewise, when the test entry control signal TS_SEL is activated to a logic high level, the integrated circuit enters the test operation mode and the first connection selection unit 640A allows the test data TS_DATA stored in the first test data storage unit 620A to be outputted through the first global line GIO_LINE_1, and allows the test data stored in the second test data storage unit 620B to be outputted through the second global line GIO_LINE_2.

In the deactivation period of the test entry control signal TS_SEL, the mode configuration control unit 610 generates the mode configuration code MD_CONF in response to the address signal ADDR loaded on the address input line ADDR_LINE, and transfers the mode configuration code MD_CONF to the internal circuit 630 through the mode configuration line MD_CONF_LINE. In addition, in the activation period of the test entry control signal TS_SEL, the mode configuration control signal 610 loads the address signal ADDR of the address input line ADDR_LINE on the mode configuration line MD_CONF_LINE as the test data TS_DATA, and transfers the loaded address signal ADDR to the first test data storage unit 620A and the second test data storage unit 620B.

Specifically, the mode configuration control unit 610 can allow the signal loaded on the mode configuration line MD_CONF_LINE to be used as two purposes by using the address signal ADDR loaded on the address input line ADDR_LINE.

That is, in the normal operation mode in which the test entry control signal TS_SEL is deactivated to a logic low level, the mode configuration control unit 610 performs an operation of newly defining the value of the mode configuration code MD_CONF in correspondence to the address signal ADDR loaded on the address input line ADDR_LINE. The mode configuration code MD_CONF whose value is newly defined is transferred through the mode configuration line MD_CONF_LINE to a plurality of circuits provided inside the integrated circuit. Thus, the plurality of circuits provided inside the integrated circuit can be newly set. The operation of setting the operation mode by transferring the mode configuration code MD_CONF to the internal circuit 630 through the mode configuration line MD_CONF_LINE is well known.

On the other hand, in the test operation mode in which the test entry control signal TS_SEL is activated to a logic high level, the address signal ADDR loaded on the address input line ADDR_LINE is outputted as the test data TS_DATA. The test data TS_DATA having the same value as that of the address signal ADDR is transferred to the first test data storage unit 620A and the second test data storage unit 620B through the mode configuration line MD_CONF_LINE. The test data TS_DATA is stored in the first test data storage unit 620A and the second test data storage unit 620B and then outputted through the first global line GIO_LINE_1 and the second global line GIO_LINE_2. The transferring the test data TS_DATA through the mode configuration line MD_CONF_LINE to the first test data storage unit 620A and the second test data storage unit 620B and storing the value of the test data TS_DATA therein has been described above.

Referring to FIG. 6B, the MPR operation circuit in the integrated circuit in accordance with the third embodiment of the present invention includes an address input line ADDR_LINE, a mode configuration control unit 610, a test data storage unit 620C, and an internal circuit 630. The address input line ADDR_LINE is configured to receive an address signal. The mode configuration control unit 610 outputs the address signal ADDR, which is inputted through the address input line ADDR_LINE, to a mode configuration line MD_CONF_LINE as test data TS_DATA or mode configuration code MD_CONF in response to a test entry control signal TS_SEL. The test data storage unit 620C stores the test data TS_DATA inputted through the mode configuration line MD_CONF_LINE in response to a test write command TS_WRITE, and output the stored test data TS_DATA through a first global line GIO_LINE_1 and a second global line GIO_LINE_2 in response to a test read command TS_READ. The internal circuit 630 is configured to set to a preset internal operation mode in response to the test entry control signal TS_SEL and the mode configuration code MD_CONF inputted through the mode configuration line MD_CONF_LINE.

In addition, the MPR operation circuit further includes a first normal data storage unit 600A and a second normal data storage unit 600B. The first normal data storage unit 600A stores normal data NR_DATA inputted through the first global line GIO_LINE_1 in response to a write command WRITE, a read command READ, and an address signal ADDR, and outputs the stored normal data NR_DATA through the first global line GIO_LINE_1. The second normal data storage unit 600B stores normal data NR_DATA inputted through the second global line GIO_LINE_2 in response to the write command WRITE, the read command READ, and the address signal ADDR, and outputs the stored normal data NR_DATA through the second global line GIO_LINE_2.

Furthermore, the MPR operation circuit further includes a first connection selection unit 640A, a second connection selection unit 640B, and a global line connection control unit 690. The first connection selection unit 640A selectively connects the first normal data storage unit 600A and the test data storage unit 620C to the first global line GIO_LINE_1 in response to the test entry control signal TS_SEL. The second connection selection unit 640B selectively connects the second normal data storage unit 600B to the second global line GIO_LINE_2 in response to the test entry control signal TS_SEL. The global line connection control unit 690 selectively connects the first global line GIO_LINE_1 to the second global line GIO_LINE_2 in response to the test entry control signal TS_SEL.

The first connection selection unit 640A and the second connection selection unit 640B may be operated in an opposite manner. That is, the first connection selection unit 640A may selectively connect the second normal data storage unit 600B to the second global line GIO_LINE_2 in response to the test entry control signal TS_SEL, and the second connection selection unit 640B may selectively connect the first normal data storage unit 600A to the test data storage unit 620C in response to the test entry control signal TS_SEL.

In addition, the MPR operation circuit further includes a test command generation unit 650 which generates the test write command TS_WRITE in response to the test entry control signal TS_SEL and the write command WRITE, and generates the test read command TS_READ in response to the test entry control signal TS_SEL and the read command READ.

In addition, the MPR operation circuit further includes a bit bandwidth expansion unit 660C which expands a bit bandwidth (8 bits) of the test data TS_DATA, outputted through the data output terminal of the test data storage unit 620 when the test read command TS_READ is activated, to a set value to thereby make the bit bandwidth equal to a bit bandwidth of the first and second global lines GIO_LINE_1 and GIO_LINE_2.

The MPR operation circuit further includes a data input/output pad DQ which is commonly connected to the first global line GIO_LINE_1 and the second global line GIO_LINE_2 and through which the normal data NR_DATA is inputted/outputted or the test data TS_DATA is outputted.

In addition, the MPR operation circuit further includes a command input unit 670 which receives a chip select signal CSB, a column strobe signal CASB, a row strobe signal RASB, and a write enable signal WEB, and generates the write command WRITE and the read command READ.

For reference, although it is illustrated in FIG. 6B as if the test command generation unit 650 and the mode configuration control signal 610 are separated from each other and individually perform their operations, this separation is intended for purposes of providing clarity. The elements can also be grouped as a single element that performs the above described operations.

In addition, in implementation, the operations of the test command generation unit 650 and the mode configuration control unit 610 may be defined in a mode register set (MRS). Therefore, a combination of the test command generation unit 650 and the mode configuration control unit 610 is illustrated in FIG. 3B.

The first global line GIO_LINE_1 and the second global line GIO_LINE_2 share the data input/output pad DQ. Such a scheme is usually used when the first normal data storage unit 600A and the second normal data storage unit 600B are disposed at opposite positions with respect to the data input/output pad DQ. This scheme may be used for a memory product group operating at a high speed.

The operation of the respective elements of the MPR operation circuit in the integrated circuit of FIG. 6B in accordance with the third embodiment of the present invention will be described in detail below.

The bit bandwidth expansion unit 660C are provided because the data bandwidth of the address input line ADDR_LINE and the data bandwidth of the first global line GIO_LINE_1 and the second global line GIO_LINE_2 differ from each other and, in general, the data bandwidth of the first global line GIO_LINE_1 and the second global line GIO_LINE_2 is greater than the data bandwidth of the address input line ADDR_LINE. That is, the test data TS_DATA are inputted to the test data storage unit 620C through the address input line ADDR_LINE, and the test data TS_DATA stored in the test data storage unit 620C are outputted through the first and second global lines GIO_LINE_1 and GIO_LINE_2.

Therefore, the bit bandwidth expansion unit 660C performs an operation of converting the test data TS_DATA (8 bits) having a small data bandwidth into the test data TS_DATA (64 bits) having a large data bandwidth. A method of repeatedly copying the same data is often used. For example, the test data TS_DATA (64 bits) having a larger data bandwidth is generated by copying the test data TS_DATA (8 bits) having a small data bandwidth eight times.

In an activation period of the test entry control signal TS_SEL, the test command generation unit 650 activates the test write command TS_WRITE when the write command WRITE is activated, and deactivates the test write command TS_WRITE when the write command WRITE is deactivated. Likewise, in the activation period of the test entry control signal TS_SEL, the test command generation unit 650 activates the test read command TS_READ when the read command READ is activated, and deactivates the test read command TS_READ when the read command READ is deactivated. In addition, in a deactivation period of the test entry control signal TS_SEL, the test command generation unit 650 deactivates the test write command TS_WRITE, regardless of whether or not the write command WRITE is activated. Likewise, in the deactivation period of the test entry control signal TS_SEL, the test command generation unit 650 deactivates the test read command TS_READ, regardless of whether or not the read command READ is activated.

The address signal ADDR inputted through the address input line ADDR_LINE includes a storage unit selection address signal SEL_ADDR and a storage space selection address signal SAV_ADDR. That is, in the third embodiment of the present invention, the element storing the normal data NR_DATA is not a single element but two elements, i.e., the first normal data storage unit 600A and the second normal data storage unit 600B. Thus, the address signal ADDR inputted through the address input line ADDR_LINE includes the storage unit selection address signal SEL_ADDR for selecting which one of the first normal data storage unit 600A and the second normal data storage unit 600B the normal data NR_DATA is to be stored in, and the storage space selection address signal SAV_ADDR for selecting which position the normal data NR_DATA is to be stored at within the selected normal data storage unit.

The first normal data storage unit 600A and the second normal data storage unit 600B may each be any reasonably suitable element corresponding to a plurality of banks including banks which perform minimum read/write operations in accordance with the third embodiment of the present invention. In addition, the storage unit selection address signal SEL_ADDR may be any reasonably suitable signal corresponding to a bank address for selecting one of a plurality of banks, and the storage space selection address signal SAV_ADDR may be any reasonably suitable signal corresponding to a row/column address for selecting a cell to or from which real data is inputted or outputted in the bank selected by the bank address.

Specifically, the first normal data storage unit 600A includes a plurality of first normal data storage spaces (not shown) which can store the normal data NR_DATA. When the first normal data storage unit 600A is selected by the storage unit selection address signal SEL_ADDR in the deactivation period of the test entry control signal TS_SEL, the first normal data storage unit 600A selects any one storage space corresponding to the storage space selection address signal SAV_ADDR among the plurality of first normal data storage spaces, and stores the normal data NR_DATA inputted through the first global line GIO_LINE_1 in the selected data storage space, and outputs the normal data NR_DATA stored in the selected storage space through the first global line GIO_LINE_1 in response to the read command READ. However, when the first normal data storage unit 600A is not selected by the storage unit selection address signal SEL_ADDR in the activation or deactivation period of the test entry control signal TS_SEL, the first normal data storage unit 600A performs no read/write operation, regardless of whether or not the write command WRITE and the read command READ are activated.

The second normal data storage unit 600B includes a plurality of second normal data storage spaces (not shown) which can store the normal data NR_DATA. When the second normal data storage unit 600B is selected by the storage unit selection address signal SEL_ADDR in the deactivation period of the test entry control signal TS_SEL, the second normal data storage unit 600B selects any one storage space corresponding to the storage space selection address signal SAV_ADDR among the plurality of second normal data storage spaces, and stores the normal data NR_DATA inputted through the second global line GIO_LINE_2 in the selected data storage space, and outputs the normal data NR_DATA stored in the selected storage space through the second global line GIO_LINE_2 in response to the read command READ. However, when the second normal data storage unit 600B is not selected by the storage unit selection address signal SEL_ADDR in the activation or deactivation period of the test entry control signal TS_SEL, the second normal data storage unit 600B performs no read/write operation, regardless of whether or not the write command WRITE and the read command READ are activated.

The configuration of the test data storage unit 620C can be divided into two schemes according to the operation thereof.

The first scheme is a scheme for a case where the test data storage unit 620C has a minimum storage space.

Specifically, a test data storage space (not shown) capable of storing the test data TS_DATA is provided inside the test data storage unit 620C, and the test data storage unit 620C stores the test data TS_DATA inputted from the mode configuration line MD_CONF_LINE in response to the test write command TS_WRITE. Likewise, the test data storage unit 620C outputs the test data TS_DATA stored in the test data storage space to the global line GIO_LINE in response to the test read command TS_READ. At this time, the test write command TS_WRITE and the test read command TS_READ are not activated when the test entry control signal TS_SEL is in a deactivated state. Thus, no data can be stored in the test data storage unit 620C when the integrated circuit operates in the normal operation mode.

That is, the test data storage unit 620C in accordance with the first scheme operates so that one address signal ADDR is stored as one test data TS_DATA in such a state where the test data storage unit 620C has a minimum storage space.

The second scheme is a scheme for a case where the test data storage unit 620C has a sufficient storage space.

Specifically, the test data storage unit 620C includes a plurality of test data storage spaces (not shown) which can be selected by values of predetermined bits TD_SEL corresponding to the storage unit selection address signal SEL_ADDR among the test data TS_DATA inputted through the mode configuration line MD_CONF_LINE, and can store the remaining bits TD_SAV corresponding to the storage space selection address signal SAV_ADDR. When the test write command TS_WRITE is activated, the test data storage unit 620C selects one storage space among the plurality of test data storage spaces according to the predetermined bits TD_SEL of the test data TS_DATA, and stores the remaining bits TD_SAV of the test data TS_DATA in the selected storage space. Likewise, when the test read command TS_READ is activated, the test data storage unit 620C outputs the value stored in the storage space selected among the plurality of test data storage spaces to the first global line GIO_LINE_1 and the second global line GIO_LINE_2 through the global line connection control unit 690 according to the predetermined bits TD_SEL of the test data TS_DATA. At this time, the predetermined bits TS_DATA of the test data TS_DATA inputted together with the test read command TS_READ is used to select the data storage space. However, the remaining bits TD_SAV of the test data TS_DATA are discarded without being used. In addition, the test write command TS_WRITE and the test read command TS_READ are not activated when the test entry control signal TS_SEL is in a deactivated state. Thus, no data can be stored in the test data storage unit 620C when the integrated circuit operates in the normal operation mode.

That is, the test data storage unit 620C in accordance with the second scheme operates so that the test data storage unit 620C performs an operation of separately storing several storage space selection address signals SEL_ADDR as several test data TS_DATA according to the storage unit selection address signal SEL_ADDR in such a state where it has a sufficient storage space.

As such, the test data storage unit 620C may be any reasonably suitable element corresponding to the MPR which stores pattern data including an MPR which performs a minimum read/write operation in accordance with the third embodiment of the present invention.

The first connection selection unit 640A connects the data input/output terminal of the first normal data storage unit 600A to the first global line GIO_LINE_1 in the normal operation mode, and connects the data output terminal of the test data storage unit 620C to the first global line GIO_LINE_1 in the test operation mode. Likewise, the second connection selection unit 640B connects the data input/output terminal of the second normal data storage unit 600B to the second global line GIO_LINE_2 in the normal operation mode, and does not connect the data input/output terminal of the second normal data storage unit 600B to the second global line GIO_LINE_2 in the test operation mode.

At this time, the first connection selection unit 640A, the second connection selection unit 640B, and the global line connection control unit 690 are interfaced with one another according to the normal operation mode and the test operation mode.

Specifically, when the test entry control signal TS_SEL used to select the normal operation mode and the test operation mode is deactivated to a logic low level (that is, to select the normal operation mode), the global line connection control unit 690 maintains the first global line GIO_LINE_1 and the second global line GIO_LINE_2 in a disconnected state. In addition, the first connection selection unit 640A allows the normal data NR_DATA to be inputted/outputted between the first normal data storage unit 600A and the first global line GIO_LINE_1, and the second connection selection unit 640B allows the normal data NR_DATA to be inputted/outputted between the second normal data storage unit 600B and the second global line GIO_LINE_2.

On the other hand, when the test entry control signal TS_SEL used to select the normal operation mode and the test operation mode is activated to a logic high level (that is, to select the normal operation mode), the global line connection control unit 690 maintains the first global line GIO_LINE_1 and the second global line GIO_LINE_2 in a connected state. In addition, the first connection selection unit 640A allows the normal data NR_DATA to be inputted/outputted between the test data storage unit 620C and the first global line GIO_LINE_1, and the second connection selection unit 640B prevents the normal data NR_DATA from being inputted/outputted between the second normal data storage unit 600B and the second global line GIO_LINE_2. Thus, the test data TS_DATA is transferred to the second global line GIO_LINE_2 through the first global line GIO_LINE_1.

Meanwhile, the difference of the MPR operation circuit of the integrated circuit of FIG. 6A in accordance with the third embodiment of the present invention from the MPR operation circuit of the integrated circuit in accordance with the second embodiment of the present invention in FIG. 2 is as follows. The normal data storage unit 200 is modified into the first normal data storage unit 600A and the second normal data storage unit 600B; the global line GIO_LINE is modified into the first global line GIO_LINE_1 and the second global line GIO_LINE_2; the test data storage unit 220 is modified into the first test data storage unit 620A and the second test data storage unit 620B; the connection selection unit 240 is modified into the first connection selection unit 640A and the second connection selection unit 640B; and the bit bandwidth expansion unit 260 is modified into the first bit bandwidth expansion unit 660A and the second bit bandwidth expansion unit 660B.

That is, the MPR operation circuit of the integrated circuit of FIG. 6A in accordance with the third embodiment of the present invention includes the first normal data storage unit 600A, the second normal data storage unit 600B, the first global line GIO_LINE_1, and the second global line GIO_LINE_2, and the input/output path of the normal data NR_DATA is two times the input/output path of the MPR operation circuit of the integrated circuit in accordance with the second embodiment of the present invention. Therefore, the MPR operation circuit of the integrated circuit of FIG. 6A in accordance with the third embodiment of the present invention includes the first test data storage unit 620A, the second test data storage unit 620B, the first connection selection unit 640A, the second connection selection unit 640B, the first bit bandwidth expansion unit 600A, and the second bit bandwidth expansion unit 600B. Thus, the MPR operation circuit of the integrated circuit in accordance with the third embodiment of the present invention can perform the same operation as that of the MPR operation circuit of the integrated circuit in accordance with the second embodiment of the present invention.

In addition, the difference of the MPR operation circuit of the integrated circuit of FIG. 6B in accordance with the third embodiment of the present invention from the MPR operation circuit of the integrated circuit in accordance with the second embodiment of the present invention is as follows. The normal data storage unit 200 is modified into the first normal data storage unit 600A and the second normal data storage unit 600B; the global line GIO_LINE is modified into the first global line GIO_LINE_1 and the second global line GIO_LINE_2; the test data storage unit 220 is modified into the test data storage unit 620C; the connection selection unit 240 is modified into the first connection selection unit 640A and the second connection selection unit 640B; the bit bandwidth expansion unit 260 is modified into the bit bandwidth expansion unit 660C; and the global line connection control unit 690 is further included.

That is, the MPR operation circuit of the integrated circuit of FIG. 6B in accordance with the third embodiment of the present invention includes the first normal data storage unit 600A, the second normal data storage unit 600B, the first global line GIO_LINE_1, and the second global line GIO_LINE_2, and the input/output path of the normal data NR_DATA is two times the input/output path of the MPR operation circuit of the integrated circuit in accordance with the second embodiment of the present invention. Notwithstanding, the MPR operation circuit of the integrated circuit of FIG. 6B in accordance with the third embodiment of the present invention further includes the global line connection control unit 690 in such a state where it includes one test data storage unit 620C, two connection selection units 640A and 640B, and one bit bandwidth expansion unit 660C. Thus, the MPR operation circuit of the integrated circuit in accordance with the third embodiment of the present invention can perform the same operation as that of the MPR operation circuit of the integrated circuit in accordance with the second embodiment of the present invention. That is, when the normal data NR_DATA is inputted/outputted through the first global line GIO_LINE_1 and the second global line GIO_LINE_2, the first global line GIO_LINE_1 and the second global line GIO_LINE_2 are not connected together. Thus, the two global lines are separately used. On the other hand, when the test data TS_DATA is outputted through the first global line GIO_LINE_1 and the second global line GIO_LINE_2, they are connected together so as to constitute a single global line.

As described above, as in the MPR operation circuit of the integrated circuit in accordance with the second embodiment of the present invention, the MPR operation circuit of the integrated circuit in accordance with the third embodiment of the present invention transfers the address signal ADDR as the test data TS_DATA through the already existing mode configuration line MD_CONF_LINE. Thus, it is possible to obtain adequate input/output characteristics of the MPR without greatly increasing the area of the integrated circuit.

That is, since the test data TS_DATA stored in the test data storage unit 620A, 620B or 620C, which is an element corresponding to the MPR, is applied to the semiconductor system through the mode configuration line MD_CONF_LINE, its value may be changed through the semiconductor system. In addition, since the test data TS_DATA is received through the mode configuration line MD_CONF_LINE which has been present in the integrated circuit, no additional line for receiving the test data TS_DATA is needed. As such, when the MPR operation circuit of the integrated circuit in accordance with the third embodiment of the present invention is applied, it is possible to meet appropriate input/output characteristics of the MPR and minimize an increase in the area of the integrated circuit.

While the present invention has been described with respect to the specific embodiments, it will be apparent to those skilled in the art that various changes and modifications may be made without departing from the spirit and scope of the invention as defined in the following claims.

For example, the types and positions of the logic gates and transistors used herein may be differently implemented, depending on the polarities of the input signals.

What is claimed is:

1. An integrated circuit comprising:
   a normal data storage unit configured to store normal data and output the stored normal data in response to a write command, a read command, and an address signal in a normal operation mode;
   a test data storage unit configured to store the address signal, which is received through an address input line, as test data in response to the write command in a test operation mode and output the stored test data in response to the read command; and
   a connection selection unit configured to selectively connect a data input/output terminal of the normal data storage unit or a data output terminal of the test data storage unit to a global line based on whether the integrated circuit is in the normal operation mode or the test operation mode.

2. The integrated circuit of claim 1, wherein the address input line receives the address signal, regardless of the operation mode,
   wherein the normal data is inputted/outputted through the global line in the normal operation mode, and
   the test data is outputted to the global line in the test operation mode.

3. The integrated circuit of claim 2, wherein the test data storage unit comprises a test data storage space which is capable of storing the test data, and
   the test data storage unit stores the address signal received through the address input line as the test data in response to the write command in the test operation mode and outputs the stored test data to the global line in response to the read command, and
   the test data storage unit does not store the address signal as the test data in the normal operation mode regardless of the write command and the read command.

4. The integrated circuit of claim 3, wherein,
   the test data storage unit comprises a plurality of test data storage spaces which are capable of being selected by values of predetermined bits of the address signal received through the address input line and capable of storing the remaining bits of the address signal as the test data,
   the test data storage unit selects any one storage space corresponding to the predetermined bits of the address signal among the plurality of test data storage spaces in the test operation mode, stores the remaining bits of the address signal as the test data in the selected storage space in response to the write command and outputs the test data stored in the selected storage space to the global line in response to the read command, and
   the test data storage unit does not store the address signal as the test data in the normal operation mode regardless of the write command and the read command.

5. The integrated circuit of claim 2, wherein the connection selection unit connects the data input/output terminal of the normal data storage unit to the global line in the normal operation mode and connects the data output terminal of the test data storage unit to the global line in response to the test operation mode.

6. The integrated circuit of claim 1, further comprising a bit bandwidth expansion unit configured to expand a bit bandwidth of the test data, which is outputted to the data output terminal of the test data storage unit in the test operation mode, to a set value to make the bit bandwidth of the test data equal to a bit bandwidth of the global line.

7. An integrated circuit comprising:
an address input line configured to receive an address signal;
a mode configuration control unit configured to receive the address signal, which is inputted through the address input line, and output the address signal as test data or mode configuration code to a mode configuration line in response to a test entry control signal;
a test data storage unit configured to store the test data received through the mode configuration line in response to a test write command and output the stored test data to a global line in response to a test read command; and
an internal circuit configured to be set to a preset internal operation mode in response to the test entry control signal and the mode configuration code received through the mode configuration line.

8. The integrated circuit of claim 7, further comprising a test command generation unit configured to generate the test write command and the test read command in response to the test entry control signal, a write command, and a read command.

9. The integrated circuit of claim 8, wherein,
the test command generation unit activates the test write command and the test read command when the write command and the read command are activated during an activation period of the test entry control signal and deactivates the test write command and the test read command when the write command and the read command are deactivated, and
the test command generation unit deactivates the test write command and the test read command during a deactivation period of the test entry control signal regardless of the activation of the write command and the read command.

10. The integrated circuit of claim 9, further comprising:
a normal data storage unit configured to store normal data received through the global line in response to the read command, the write command, and the address signal received through the address input line, and output the stored normal data to the global line; and
a connection selection unit configured to selectively connect the normal data storage unit or the test data storage unit to the global line in response to a first state or the second state of the test entry control signal, respectively.

11. The integrated circuit of claim 10, wherein,
the test data storage unit comprises a test data storage space which is capable of storing the test data,
the test data storage unit stores the test data received through the mode configuration line in response to the test write command, and
the test data storage unit outputs the stored test data to the global line in response to the test read command.

12. The integrated circuit of claim 10, wherein,
the test data storage unit comprises a plurality of test data storage spaces which are capable of being selected by values of predetermined bits of the test data received through the mode configuration line and capable of storing the remaining bits of the test data,
the test data storage unit selects any one storage space corresponding to the predetermined bits of the test data among the plurality of test data storage spaces when the test write command is activated and stores the remaining bits of the test data in the selected storage space when the test write command is activated, and
the test data storage unit outputs the value stored in one of the plurality of test data storage spaces according to the predetermined bits of the test data to the global line when the test read command is activated.

13. The integrated circuit of claim 10, wherein the connection selection unit connects a data input/output terminal of the normal data storage unit to the global line during a deactivation period of the test entry control signal and connects a data output terminal of the test data storage unit to the global line during an activation period of the test entry control signal.

14. The integrated circuit of claim 7, wherein,
the mode configuration control unit generates the mode configuration code in response to the address signal loaded on the address input line and transfer the mode configuration code to the mode configuration line during a deactivation period of the test entry control signal, and
the mode configuration control unit loads the address signal, which is loaded on the address input line, on the mode configuration line as the test data and transfers the loaded address signal to the test data storage unit during an activation period of the test entry control signal.

15. The integrated circuit of claim 7, further comprising a bit bandwidth expansion unit configured to expand a bit bandwidth of the test data, which is outputted to a data output terminal of the test data storage unit, to a set value when the test read command is activated, to make the bit bandwidth of the test data equal to a bit bandwidth of the global line.

16. An integrated circuit comprising:
an address input line configured to receive an address signal;
a mode configuration control unit configured to receive the address signal, which is inputted through the address input line, and output the address signal as test data or mode configuration code to a mode configuration line in response to a test entry control signal;
a test data storage unit configured to store the test data received through the mode configuration line in response to a test write command and output the stored test data to a first global line and a second global line in response to a test read command; and
an internal circuit configured to be set to a preset internal operation mode in response to the test entry control signal and the mode configuration code received through the mode configuration line.

17. The integrated circuit of claim 16, further comprising:
a first normal data storage unit configured to store normal data received through the first global line in response to the write command, the read command, and the address signal and output the stored normal data to the first global line; and
a second normal data storage unit configured to store the normal data received through the second global line in response to the write command, the read command, and the address signal and output the stored normal data to the second global line.

18. The integrated circuit of claim 17, wherein the test data storage unit comprises:
a first normal data storage unit configured to store the test data received through the mode configuration line in response to the test write command and output the stored test data to the first global line in response to the test read command; and
a second test data storage unit configured to store the test data received through the mode configuration line in response to the test write command and output the stored test data to the second global line in response to the test read command.

19. The integrated circuit of claim 18, further comprising a connection selection unit configured to selectively connect the first normal data storage unit and the first test data storage unit to the first global line in response to the test entry control signal and selectively connect the second normal data storage unit and the second test data storage unit to the second global line in response to the test entry control signal.

20. The integrated circuit of claim 19, wherein,
the connection selection unit connects the first normal data storage unit to the first global line and connects the second normal data storage unit to the second global line during a deactivation period of the test entry control signal, and
the connection selection unit connects the first test data storage unit to the first global line and connects the second test data storage unit to the second global line during an activation period of the test entry control signal.

21. The integrated circuit of claim 17, further comprising:
a connection selection unit configured to selectively connect the first normal data storage unit and the test data storage unit to the first global line and selectively connect the second normal data storage unit to the second global line in response to the test entry control signal; and
a global line connection control unit configured to selectively connect the first global line to the second global line in response to the test entry control signal.

22. The integrated circuit of claim 21, wherein,
the connection selection unit connects a data input/output terminal of the first normal data storage unit to the first global line and connects a data input/output terminal of the second normal data storage unit to the second global line during a deactivation period of the test entry control signal, and
the connection selection unit connects a data output terminal of the test data storage unit and does not connect the data input/output terminal of the second normal data storage unit to the second global line during an activation period of the test entry control signal.

23. The integrated circuit of claim 22, wherein,
the global line connection control unit connects the first global line to the second global line during the activation period of the test entry control signal, so that the test data stored in the test data storage unit is outputted to the second global line to the first global line, and
the global line connection control unit does not connect the first global line to the second global line during the deactivation period of the test entry control signal, so that the first normal data storage unit inputs/outputs the normal data to the first global line, and the second normal data storage unit inputs/outputs the normal data to the second global line.

24. The integrated circuit of claim 17, further comprising a test command generation unit configured to generate the test write command and the test read command in response to the test entry control signal, the write command, and the read command.

25. The integrated circuit of claim 24, wherein,
the test command generation unit activates the test write command and the test read command when the write command and the read command are activated during an activation period of the test entry control signal and deactivates the test write command and the test read command when the write command and the read command are deactivated, and
the test command generation unit deactivates the test write command and the test read command during a deactivation period of the test entry control signal regardless of the activation of the write command and the read command.

26. The integrated circuit of claim 25, further comprising a data input/output pad commonly connected to the first global line and the second global line and configured to input/output the normal data or output the test data.

27. The integrated circuit of claim 26, wherein the address signal received through the address input line comprises a storage unit selection address signal and a storage space selection address signal.

28. The integrated circuit of claim 27, wherein,
the mode configuration control unit generates the mode configuration code in response to the address signal loaded on the address input line during the deactivation period of the test entry control signal and transfers the mode configuration code to the mode configuration line, and
the mode configuration control unit loads the address signal, which is loaded on the address input line, on the mode configuration line as the test data and transfers the loaded address signal to the test data storage unit during the activation period of the test entry control signal.

29. The integrated circuit of claim 28, wherein,
the test data storage unit comprises a test data storage space which is capable of storing the test data,
the test data storage unit stores the test data received through the mode configuration line in response to the test write command, and
the test data storage unit outputs the stored test data to the first global line and the second global line in response to the test read command.

30. The integrated circuit of claim 28, wherein,
the test data storage unit comprises a plurality of test data storage spaces which are capable of being selected by values of predetermined bits corresponding to the storage unit selection address signal among the test data received through the mode configuration line and are capable of storing the remaining bits corresponding to the storage space selection address signal,
the test data storage unit selects one storage space among the plurality of test data storage spaces according to the predetermined bits of the test data when the test write command is activated, and
the test data storage unit outputs the value stored in any one storage space, which is selected according to the predetermined bits of the test data among the plurality of test data storage spaces, to the first global line and the second global line when the test read command is activated.

31. The integrated circuit of claim 16, further comprising a bit bandwidth expansion unit configured to expand a bit bandwidth of the test data, which is outputted to a data output terminal of the test data storage unit, to a set value when the test read command is activated, to make the bit bandwidth of the test data equal to a bit bandwidth of the first and second global lines.

* * * * *